United States Patent
Sandusky et al.

(10) Patent No.: US 11,736,006 B2
(45) Date of Patent: Aug. 22, 2023

(54) PRE-CHARGING A VOLTAGE CONVERTER

(71) Applicant: SMART PRONG TECHNOLOGIES, INC., Irvine, CA (US)

(72) Inventors: Randall Sandusky, Irvine, CA (US); Neaz Farooqi, Irvine, CA (US)

(73) Assignee: SMART PRONG TECHNOLOGIES, INC., Irvine, CA (US)

( * ) Notice: Subject to any disclaimer, the term of this patent is extended or adjusted under 35 U.S.C. 154(b) by 0 days.

(21) Appl. No.: 17/815,523

(22) Filed: Jul. 27, 2022

(65) Prior Publication Data

US 2022/0368223 A1 Nov. 17, 2022

Related U.S. Application Data

(63) Continuation of application No. 16/804,348, filed on Feb. 28, 2020, now Pat. No. 11,431,243.

(51) Int. Cl.
  *H02M 3/07* (2006.01)
  *H02M 1/36* (2007.01)
  *H02M 1/00* (2006.01)
  *H03K 19/20* (2006.01)
  *H03K 19/0175* (2006.01)

(52) U.S. Cl.
  CPC .............. *H02M 3/07* (2013.01); *H02M 1/00* (2013.01); *H02M 1/36* (2013.01); *H02M 1/0012* (2021.05); *H03K 19/017509* (2013.01); *H03K 19/20* (2013.01)

(58) Field of Classification Search
  CPC ......... H02M 3/07; H02M 1/0012; H02M 1/00
  See application file for complete search history.

(56) References Cited

U.S. PATENT DOCUMENTS

| | | | |
|---|---|---|---|
| 7,397,677 B1 | 7/2008 | Collins et al. | |
| 10,671,111 B1 | 6/2020 | Spaggiari et al. | |
| 11,063,516 B1* | 7/2021 | Kim .................. | H02M 3/07 |
| 2008/0273007 A1* | 11/2008 | Ng ..................... | G09G 3/16 |
| | | | 345/107 |
| 2011/0211717 A1* | 9/2011 | Hoevesteen ......... | H04R 25/505 |
| | | | 381/323 |

(Continued)

FOREIGN PATENT DOCUMENTS

| CN | 103190056 A | 7/2013 |
|---|---|---|
| CN | 110495086 A | 11/2019 |

(Continued)

*Primary Examiner* — Sisay G Tiku
(74) *Attorney, Agent, or Firm* — Maschoff Brennan

(57) ABSTRACT

A system may include a pre-charge stage and a voltage converter. The pre-charge stage may include a controller circuit configured to generate a control voltage and a current regulator electrically coupled to the controller circuit and configured to generate a first voltage, a second voltage, and a third voltage. The voltage converter may include a capacitor, a hold capacitor, and switches. The capacitor may include a first plate and a voltage on the first plate may be equal to the first voltage. The capacitor may include a second plate and a voltage on the second plate may be equal to the second voltage. The hold capacitor may include a plate and a voltage on the plate may be equal to the third voltage. The current regulator may be configured to regulate a current on the switches during accumulation of an initial charge on the capacitor and the hold capacitor.

20 Claims, 6 Drawing Sheets

(56) References Cited

U.S. PATENT DOCUMENTS

| | | |
|---|---|---|
| 2013/0200860 A1 | 8/2013 | Takeda et al. |
| 2014/0285109 A1* | 9/2014 | Liao .................. H05B 45/3725 |
| | | 315/291 |
| 2015/0124546 A1* | 5/2015 | Son ....................... G11C 5/147 |
| | | 323/284 |
| 2015/0145495 A1 | 5/2015 | Tournatory |
| 2015/0207401 A1* | 7/2015 | Zhang ..................... H02M 3/07 |
| | | 323/271 |
| 2016/0094213 A1 | 3/2016 | Liu et al. |
| 2016/0118906 A1 | 4/2016 | Freeman et al. |
| 2017/0099011 A1 | 4/2017 | Freeman et al. |
| 2017/0255214 A1 | 9/2017 | Ho et al. |
| 2017/0279349 A1 | 9/2017 | Nork et al. |
| 2017/0279350 A1 | 9/2017 | Liu et al. |
| 2017/0288533 A1 | 10/2017 | Sandusky et al. |
| 2018/0013342 A1 | 1/2018 | Cherniak et al. |
| 2018/0034376 A1 | 2/2018 | Cattani et al. |
| 2018/0041114 A1 | 2/2018 | Sandusky et al. |
| 2018/0337586 A1 | 11/2018 | Choi et al. |
| 2019/0214902 A1 | 7/2019 | Liu et al. |
| 2020/0153331 A1 | 5/2020 | Li et al. |
| 2020/0228010 A1 | 7/2020 | Wiktor et al. |
| 2020/0350821 A1 | 11/2020 | Cannillo et al. |
| 2021/0111726 A1 | 4/2021 | Jang et al. |
| 2021/0119582 A1 | 4/2021 | Cappello et al. |
| 2021/0249955 A1 | 8/2021 | Routledge |

FOREIGN PATENT DOCUMENTS

| | | |
|---|---|---|
| EP | 2897270 A1 | 7/2015 |
| WO | 2012151466 A2 | 11/2012 |

* cited by examiner

PRE-CHARGING A VOLTAGE CONVERTER

CROSS-REFERENCE TO RELATED APPLICATION

This patent application is a continuation of U.S. patent application Ser. No.: 16/804,348 filed Feb. 28, 2020, titled "PRE-CHARGING A VOLTAGE CONVERTER", which is incorporated in the present disclosure by reference in its entirety.

FIELD

The embodiments discussed in the present disclosure are related to pre-charging a voltage converter.

BACKGROUND

A voltage converter may receive an input signal at an input voltage and generate an output signal at an output voltage. The output voltage may be an up-converted, down-converted, or unchanged version of the input voltage based on a gain setting that is being implemented by the voltage converter. The voltage converter may implement a network of switches and capacitors to convert the input voltage to the output voltage.

The subject matter claimed in the present disclosure is not limited to embodiments that solve any disadvantages or that operate only in environments such as those described above. Rather, this background is only provided to illustrate one example technology area where some embodiments described in the present disclosure may be practiced.

SUMMARY

One or more embodiments of the present disclosure may include a system that includes a pre-charge stage and a voltage converter. The pre-charge stage may include a controller circuit and a current regulator. The controller circuit may be configured to generate a control voltage based on an input voltage. The current regulator may be electrically coupled to the controller circuit and may be configured to generate a first voltage, a second voltage, and a third voltage based on the input voltage and the control voltage. The voltage converter may include a capacitor, a hold capacitor, and multiple switches. The capacitor may include a first plate electrically coupled to the pre-charge stage. A voltage on the first plate may be equal to the first voltage. The capacitor may also include a second plate electrically coupled to the pre-charge stage. A voltage on the second plate may be equal to the second voltage. The hold capacitor may include a plate electrically coupled to the pre-charge stage. A voltage on the plate may be equal to the third voltage. The multiple switches may be electrically coupled to the capacitor and the hold capacitor. The current regulator may be further configured to regulate a current on the switches during accumulation of an initial charge on the capacitor and the hold capacitor.

One or more embodiments of the present disclosure may include a system that includes a pre-charge stage and a voltage converter. The pre-charge stage may include a controller circuit, a current regulator, and a feedback circuit. The controller circuit may be configured to compare an input voltage to a scaled feedback voltage. The controller circuit may also be configured to generate a control voltage based on the comparison. The current regulator may be electrically coupled to the controller circuit. The current regulator may be configured to generate a first voltage, a second voltage, and a third voltage based on the input voltage and the control voltage. The current regulator may also be configured to generate a feedback voltage based on the first voltage and the third voltage. The feedback circuit may be electrically coupled to the controller circuit and the current regulator. The feedback circuit may be configured to scale the feedback voltage to the scaled feedback voltage. The voltage converter may include a capacitor, a hold capacitor, and multiple switches. The capacitor may include a first plate and a second plate. Both, the first plate and the second plate may be electrically coupled to the pre-charge stage. A voltage on the first plate may be equal to the first voltage. A voltage on the second plate may be equal to the second voltage. The hold capacitor may include a plate electrically coupled to the pre-charge stage. A voltage on the plate being equal to the third voltage. The multiple switches may be electrically coupled to the capacitor and the hold capacitor. The current regulator may be further configured to regulate a current on the switches during accumulation of an initial charge on the capacitor and the hold capacitor.

The object and advantages of the embodiments will be realized and achieved at least by the elements, features, and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

Example embodiments will be described and explained with additional specificity and detail through the use of the accompanying drawings in which.

DETAILED DESCRIPTION

Figure 1:
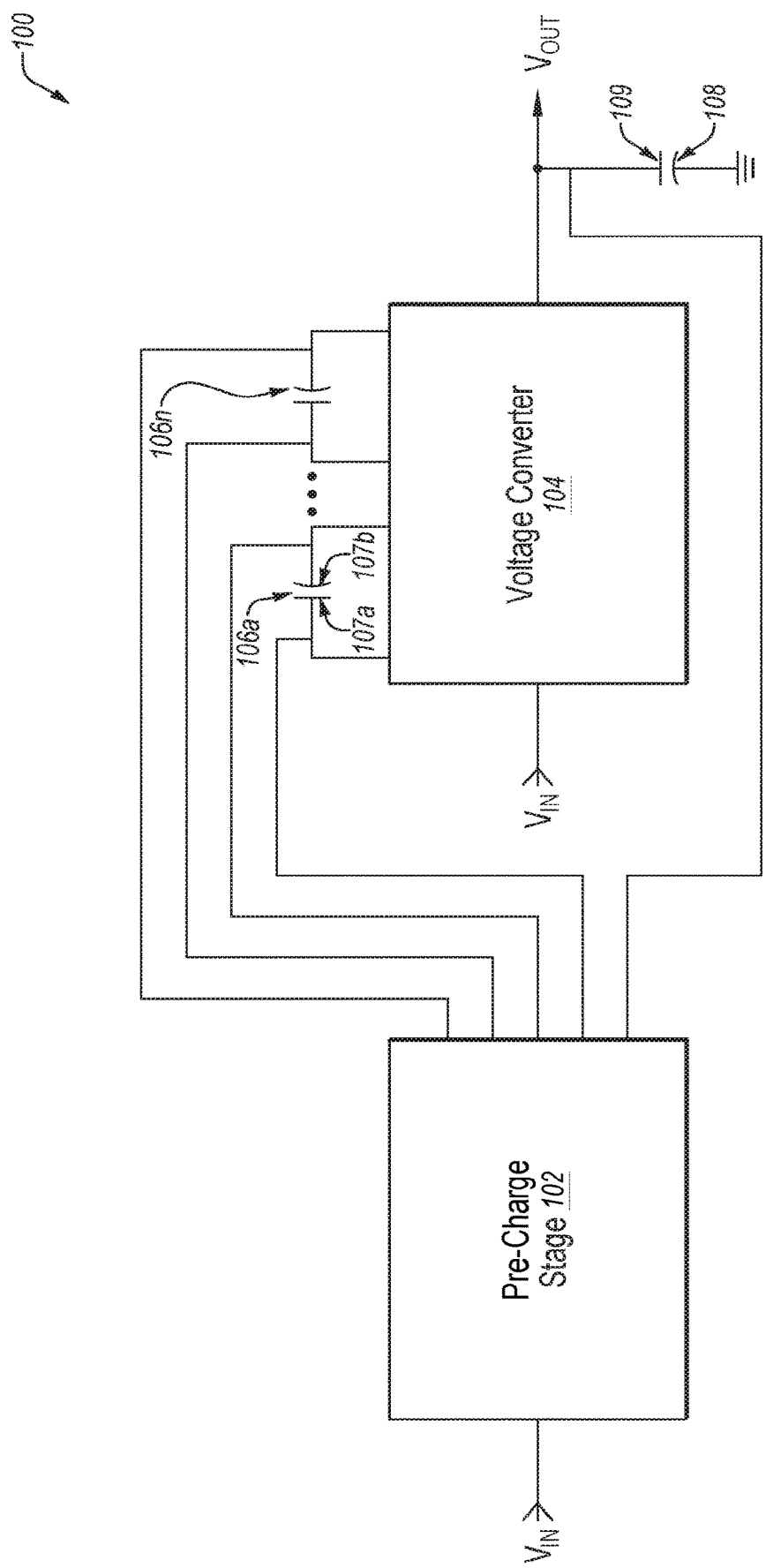
FIG. 1 illustrates an example system to pre-charge a switched capacitor voltage converter.

A voltage converter may receive an input signal at an input voltage level, generally referred to in the present disclosure as input voltage. The voltage converter may generate an output signal at an output voltage level, generally referred to in the present disclosure as output voltage. The output voltage may be an up-converted, down-converted, or unchanged version of the input voltage based on a gain setting that is being implemented by the voltage converter. The voltage converter may implement a network of switches and capacitors (e.g., one or more flying capacitors and a hold capacitor) to convert the input voltage to the output voltage. The voltage converter may be referred to in the present disclosure as a switched capacitor voltage converter (SCVC).

In some voltage converter technologies, prior to an operation phase, the capacitors and the hold capacitor of the SCVC may be at a voltage level that is less than a steady state voltage for the capacitor or the hold capacitor. For example, the voltages of the capacitors and the hold capacitor may be equal to a ground potential (e.g., zero volts). As the SCVC enters the operation phase (e.g., during initialization of the voltage converter), the capacitors and the hold capacitor may accumulate initial charges and the switches may be exposed to currents (e.g., inrush currents). In some embodiments, the currents may be equal to an input voltage divided by a resistance of a particular switch. For example, if the input voltage is equal to one hundred seventy volts and the particular switch includes a resistance of two ohms, the current the particular switch may be exposed to may be equal to eighty-five amps. If the currents that the switches are exposed to are large currents, the switches may be damaged during initialization of the voltage converter. For example, large currents may be equal to or greater than one amp. Some voltage converter technologies may increase a size of the switches to withstand the large currents. These voltage converter technologies may increase a circuit footprint of the switches and may increase a voltage of a control signal to operate the switches.

Some embodiments described in the present disclosure may implement a pre-charge stage to pre-charge the capacitors and the hold capacitor. In these and other embodiments, the pre-charge stage may regulate (e.g., control) the currents that the switches are exposed to during accumulation of the initial charges on the capacitors and the hold capacitor during a pre-charge phase to prevent the switches from being exposed to large currents. According to some embodiments described in the present disclosure, the capacitors or the hold capacitor may be pre-charged to a steady state voltage during the pre-charge phase that is based on the gain setting of the SCVC. For example, the capacitors or the hold capacitor may be pre-charged such that the steady state voltages are equal to the input voltage. As another example, the capacitors or the hold capacitor may be pre-charged such that the steady state voltages are greater (e.g., two times) than the input voltage. As yet another example, the capacitors or the hold capacitor may be pre-charged such that the steady state voltages are less than the input voltage (e.g., half).

In some embodiments, the pre-charge stage may include a controller circuit and a current regulator. The controller circuit may generate a control voltage that is based on the input voltage. The current regulator may be electrically coupled to the controller circuit. In addition, the current regulator may generate a first voltage, a second voltage, and a third voltage based on the input voltage and the control voltage. The voltage converter may be electrically coupled to the pre-charge stage.

In some embodiments, a first plate of one of the capacitors in the voltage converter may be electrically coupled to the pre-charge stage. In these and other embodiments, a potential (e.g., a voltage) on the first plate may be pre-charged to be equal to the first voltage. Additionally or alternatively, a second plate of one of the capacitors in the voltage converter may be electrically coupled to the pre-charge stage. In some embodiments, the potential on the second plate may be pre-charged to be equal to the second voltage. Further, in these and other embodiments, the hold capacitor may include a plate that is electrically coupled to the pre-charge stage. The potential on the plate of the hold capacitor may be pre-charged to be equal to the third voltage. The switches may be electrically coupled to the capacitors and the hold capacitor. The current regulator may regulate the inrush current (e.g., the current on the switches) during accumulation of the initial charge of the capacitor and the hold capacitor during a pre-charge phase.

Accordingly, one or more embodiments described in the present disclosure may regulate the currents that the switches of the SCVC are exposed to during accumulation of the initial charges. In addition, one or more embodiments described in the present disclosure may reduce or otherwise prevent damage to the switches of the SCVC without increasing the circuit footprint of the switches of the SCVC. Further, one or more embodiments, described in the present disclosure may regulate the currents that the switches of the SCVC are exposed to during accumulation of the initial charges without increasing the voltage of the control signal to operate the switches of the SCVC. In addition, one or more embodiments described in the present disclosure may reduce or otherwise eliminate transient currents such as inrush currents during the operation phase (e.g., switch-mode operation) of the SCVC.

These and other embodiments of the present disclosure will be explained with reference to the accompanying figures. It is to be understood that the figures are diagrammatic and schematic representations of such example embodiments, and are not limiting, nor are they necessarily drawn to scale. In the figures, features with like numbers indicate like structure and function unless described otherwise.

FIG. 1 illustrates an example system 100 to pre-charge a SCVC 104 (illustrated in FIGS. 1-2 and referred to in the present disclosure as voltage converter 104), in accordance with at least one embodiment described in the present disclosure. The system 100 may include a pre-charge stage 102 and the voltage converter 104. The voltage converter 104 may include a first capacitor 106a and an Nth capacitor 106n (referenced individually in the present disclosure as "capacitor 106" and collectively in the present disclosure as "capacitors 106"). As indicated by the ellipsis and the $N^{th}$ capacitor 106n in FIG. 1, the voltage converter 104 may include any appropriate number of capacitors 106. The voltage converter 104 may also include a hold capacitor 108.

The system 100 may be configured to operate in the pre-charge phase and an operation phase (e.g., switch-mode operation). The pre-charge stage 102 may be configured to pre-charge the capacitor 106 or the hold capacitor 108 to the steady state voltages during the pre-charge phase. In some embodiments, the pre-charge phase may occur for a period of time that is based on the steady state voltage that the capacitor 106 or the hold capacitor 108 are to be pre-charged to. For example, the period of time may be determined based on equation 1:

$$dt = (C * dV)/I \qquad \text{Equation 1}$$

In equation 1, dt may be the amount of time to charge the capacitor 106 or the hold capacitor 108, C may be a capacitance rating of the capacitor 106 or the hold capacitor 108, dV is the voltage the capacitor 106 or the hold capacitor is to be pre-charged to, and I may be the inrush current. In these and other embodiments, the period of time (e.g., a programmable time period) may be programmed by a user. Alternatively, the period of time may be determined by a manufacturer of the system 100.

The voltage converter 104 may receive an input signal at an input voltage (illustrated in FIGS. 1-4 as $V_{IN}$). In addition, the voltage converter 104 may generate an output signal at an output voltage (illustrated in FIGS. 1-4 as $V_{OUT}$). In some embodiments, the voltage converter 104 may be configured as a Buck direct current (DC)-DC voltage converter, which may down-convert the input voltage to cause the output voltage to be less than the input voltage. In other embodiments, the voltage converter 104 may be configured as a Boost DC-DC voltage converter to up-convert the input voltage to cause the output voltage to be greater than the input voltage. The ratio of conversion of the input voltage (e.g., the gain setting of the voltage converter 104) may be controlled by a network of switches and the capacitor 106 within the voltage converter 104. The switches of the voltage converter 104 may be electrically coupled to the capacitor 106 and the hold capacitor 108. The switches of the voltage converter 104 may transition between an open position and a closed position in particular sequences based on the gain setting or clock signals. Specific configurations and sequences of the switches of the voltage converter 104 are discussed in more detail below.

General operation of the system 100 during the pre-charge phase will now be discussed. The pre-charge stage 102 may receive the input signal at the input voltage. The pre-charge stage 102 may generate one or more voltages (e.g., the first voltage, the second voltage, or the third voltage) based on the input voltage. In some embodiments, the pre-charge stage 102 may pre-charge one or more plates of the capacitor 106 or the hold capacitor 108 to be equal to one of the voltages that are generated based on the input voltage. For example, the pre-charge stage 102 may pre-charge a first plate 107a of the first capacitor 106a to be equal to the first voltage, a second plate 107b of the first capacitor 106a to be equal to the second voltage, and a plate 109 of the hold capacitor 108 to be equal to the third voltage.

The pre-charge stage 102 may regulate the currents within the voltage converter 104 while the capacitor 106 or the hold capacitor 108 are being pre-charged (e.g., during accumulation of an initial charge on the capacitor 106 or the hold capacitor 108). For example, the pre-charge stage 102 may include various components that are configured to limit the current that may occur while the capacitor 106 or the hold capacitor 108 are being pre-charged. Pre-charging the capacitor 106 or the hold capacitor 108 prior to the operation phase of the system 100 may prevent or reduce spikes in the currents within the voltage converter 104 during the operation phase due to the capacitor 106 and the hold capacitor 108 being pre-charged.

At initiation of the operation phase, the current on the switches of the voltage converter 104 (e.g., the inrush current) may be reduced due to the capacitor 106 or the hold capacitor 108 being pre-charged to the steady state voltages. During the operation phase, the switches of the voltage converter 104 may transition between the open position and the closed position to apply the particular gain to the input voltage to generate the output voltage. Generally, the discussion in the present disclosure is directed to pre-charging a single capacitor 106 or the hold capacitor 108. Other capacitors 106 (e.g., the Nth capacitor 106n) may be pre-charged using the same or similar operations as discussed in relation to pre-charging the single capacitor 106.

Figure 2:
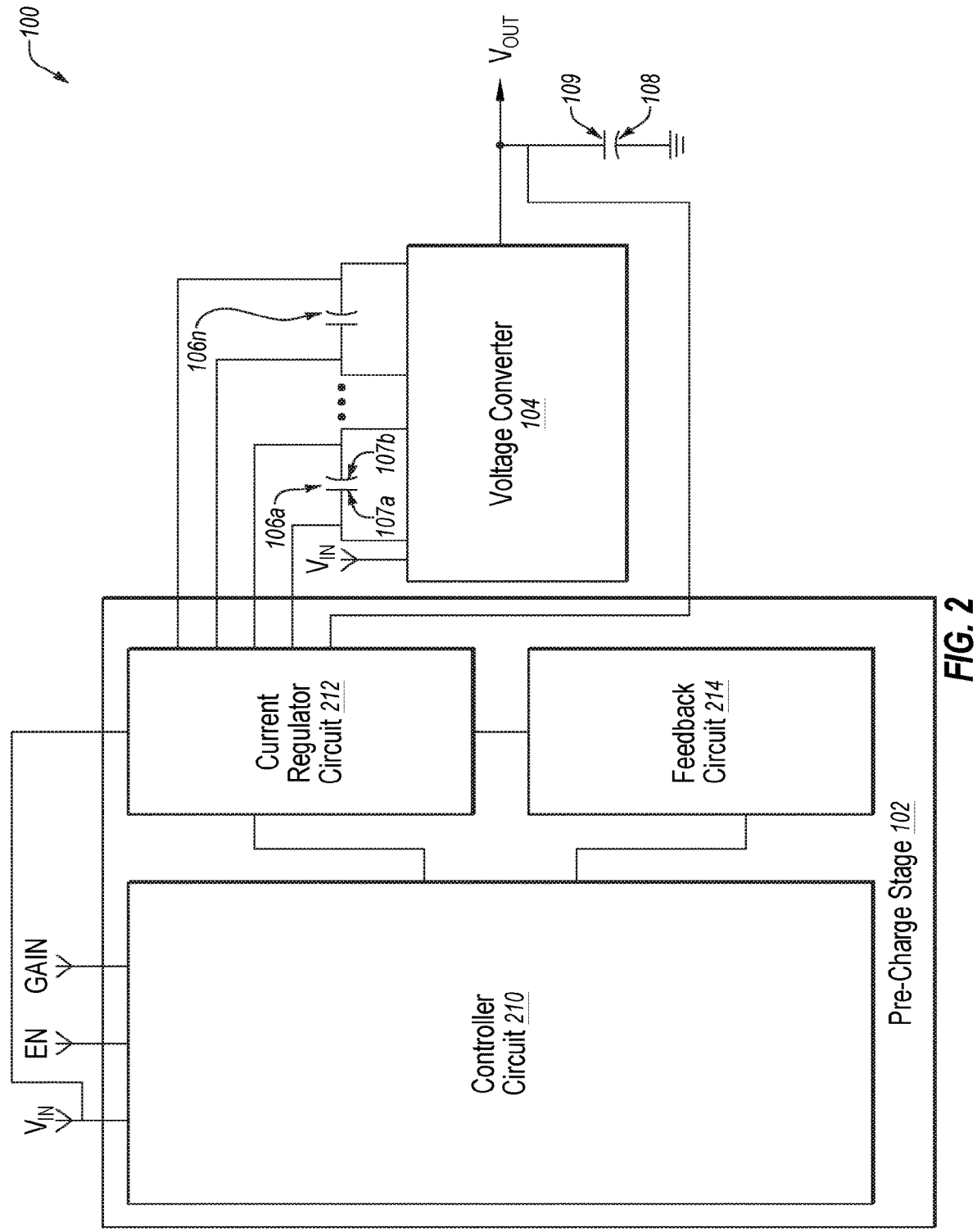
FIG. 2 illustrates an example configuration of the system of FIG. 1.

FIG. 2 illustrates an example configuration of the system 100 of FIG. 1, in accordance with at least one embodiment described in the present disclosure. The pre-charge stage 102 may include a controller circuit 210, a current regulator circuit 212, and a feedback circuit 214. The controller circuit 210 may be electrically coupled to the current regulator circuit 212 and the feedback circuit 214. In addition, the current regulator circuit 212 may be electrically coupled to the feedback circuit 214 and the voltage converter 104. The current regulator circuit 212 may be electrically coupled to the capacitor 106 or the hold capacitor 108. For example, the current regulator circuit 212 may be electrically coupled to the first plate 107a and the second plate 107b of the first capacitor 106a and the plate 109 of the hold capacitor 108.

General operation of the system 100 during the pre-charge phase will now be discussed. The controller circuit 210 may receive the input voltage. The controller circuit 210 may also receive a gain voltage (illustrated in FIGS. 2-4 as GAIN). In some embodiments, the gain voltage may include a digital voltage in which a high voltage indicates a second gain setting is to be used and a low voltage indicates a first gain setting is to be used. For example, the high voltage of the gain voltage may indicate the second gain setting is to be used and the low voltage of the gain voltage may indicate the first gain setting is to be used. In other embodiments, the gain voltage may include a digital bus signal where multiple gain settings may be selected as a function of a binary decoder configured to receive the gain voltage (not illustrated in FIG. 2). For example, a digital bus signal such as GAIN[2:0] may permit eight different gain settings to be selected.

Figure 3:
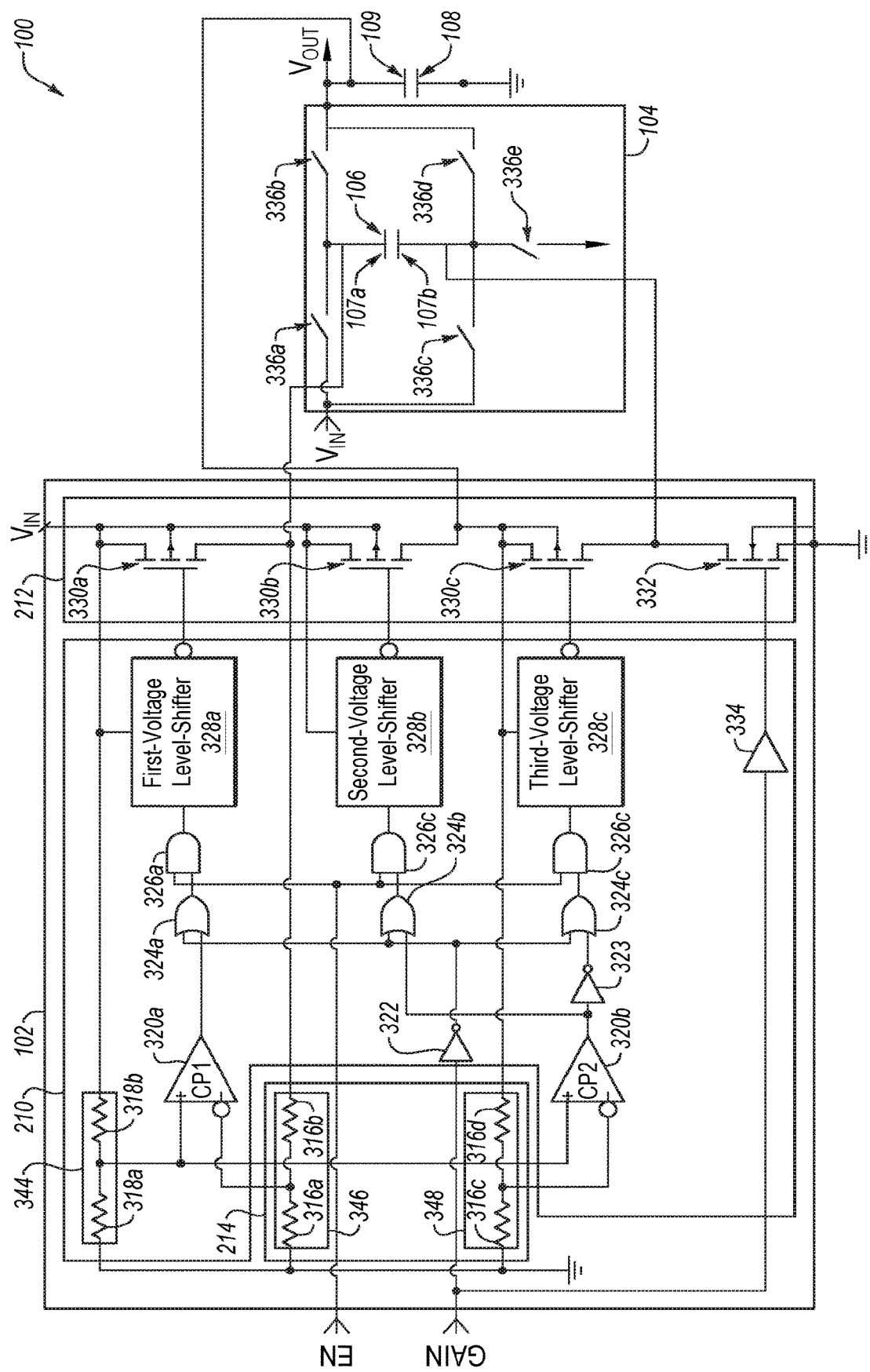
FIG. 3 illustrates yet another example configuration of the system of FIG. 1.
Figure 4:
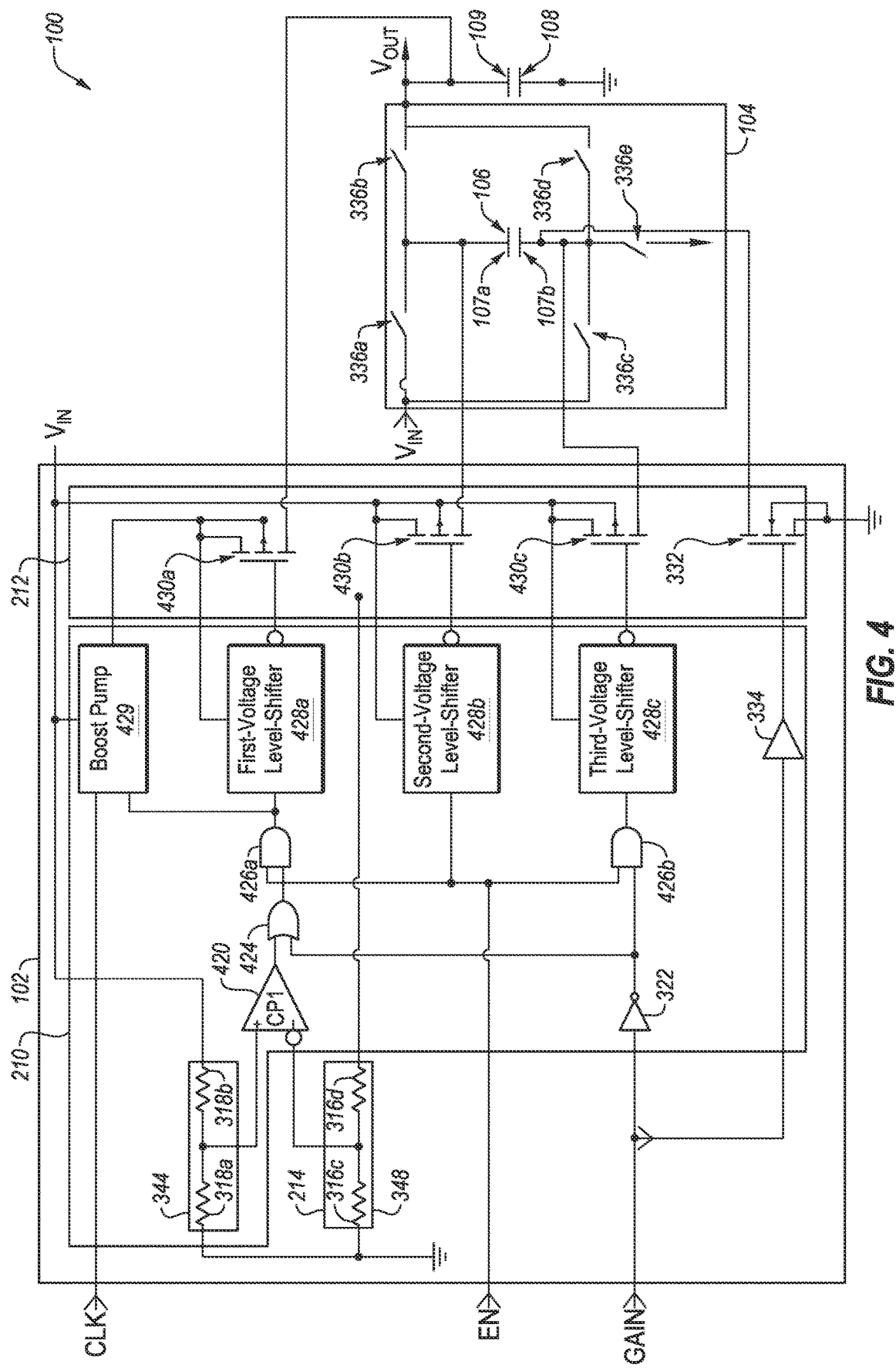
FIG. 4 illustrates another example configuration of the system of FIG. 1.

The controller circuit 210 may receive an enable voltage (illustrated in FIGS. 2-4 as EN). The enable voltage may include a digital voltage in which a high voltage indicates that the pre-charge phase is to occur or is occurring and a low voltage indicates that the operation phase or non-operation of the system 100 is to occur or is occurring. In addition, the controller circuit 210 may receive a scaled feedback voltage from the feedback circuit 214. In some embodiments, the controller circuit 210 may generate a control voltage based on the input voltage, the enable voltage, the gain voltage, the scaled feedback voltage, or some combination thereof.

The current regulator circuit 212 may receive the input voltage and the control voltage. In some embodiments, the current regulator circuit 212 may generate the voltages for pre-charging the capacitor 106 or the hold capacitor 108 (e.g., the first voltage, the second voltage, or the third voltage). In some embodiments, the voltages for pre-charging the capacitor 106 or the hold capacitor 108 may be generated by the current regulator circuit 212 based on the input voltage and the control voltage. In these and other embodiments, the control voltage may control whether one or more switches in the current regulator circuit 212 are in the open position or the closed position as discussed in more detail below. In some embodiments, the current regulator circuit 212 may provide the currents to pre-charge the capacitor 106 or the hold capacitor 108 based on the input voltage.

The current regulator circuit 212 may regulate the currents within the voltage converter 104 during the pre-charge phase. For example, the switches within the current regulator circuit 212 may be configured to limit the currents that may occur while the capacitor 106 or the hold capacitor 108 are being pre-charged (e.g., the currents to pre-charge the capacitor 106 or the hold capacitor 108 may be limited). In some embodiments, the current regulator circuit 212 may regulate the currents within the voltage converter 104 during accumulation of the initial charge on the capacitor 106 or the hold capacitor 108.

In some embodiments, the current regulator circuit 212 may generate a feedback voltage. In these and other embodiments, the feedback voltage may be generated based on one or more of the voltages for pre-charging the capacitor 106 or the hold capacitor 108. For example, the feedback voltage may be generated based on the first voltage, the third voltage, or a combination thereof. In some embodiments, the feedback circuit 214 may scale the feedback voltage to the scaled feedback voltage.

In some embodiments, the pre-charge phase may occur while the enable voltage is equal to the high voltage. Upon the expiration of the period of time for the pre-charge phase, the enable voltage may change to the low voltage and the operation phase or non-operation of the system 100 may be initiated. In some embodiments, during the operation phase, the pre-charge stage 102 may not operate.

FIG. 3 illustrates yet another example configuration of the system 100 of FIG. 1, in accordance with at least one embodiment described in the present disclosure. General operation of the system 100 during the pre-charge phase will now be discussed. The controller circuit 210 may include a voltage regulator 344. The voltage regulator 344 may include multiple resistors 318*a-b* that are configured as a voltage divider. The voltage regulator 344 may scale the input voltage to a scaled input voltage. In some embodiments, the resistors 318*a-b* may generate the scaled input voltage as a divided version of the input voltage. For example, the scaled input voltage may be equal to the input voltage divided by two. In these and other embodiments, a size, a voltage rating, or a current rating of the resistors 318*a-b* may be based on the input voltage.

The controller circuit 210 may include a first comparator 320*a* and a second comparator 320*b* (generally referred to in the present disclosure as "comparators 320"). The comparators 320 may be electrically coupled to the voltage regulator 344. More specifically, positive inputs of the comparators 320 may be electrically coupled to the voltage regulator 344 such that the scaled input voltage is a reference voltage on the positive input of the comparators 320. In some embodiments, the resistors 318*a-b* of the voltage regulator 344 may be scaled to change a state of the comparators 320 (e.g., cause the first comparison voltage or the second comparison voltage to switch between the high voltage or the low voltage) if the voltage on the first plate 107*a* of the capacitor 106 or the plate 109 of the hold capacitor 108 is equal to or greater than the input voltage divided by two.

A negative input of the first comparator 320*a* may be electrically coupled to a first feedback voltage regulator 346. In some embodiments, the first comparator 320*a* may compare the scaled input voltage to a first scaled feedback voltage received from the first feedback voltage regulator 346. In these and other embodiments, the first comparator 320*a* may generate a first comparison voltage based on the comparison of the scaled input voltage to the first scaled feedback voltage. The first comparison voltage may include a digital voltage that may be equal to a high voltage or a low voltage in a first voltage range. In some embodiments, the first comparison voltage being equal to the high voltage may indicate that the scaled input voltage is greater than the first scaled feedback voltage and the first comparison voltage being equal to the low voltage may indicate that the first scaled feedback voltage is greater than the scaled input voltage.

A negative input of the second comparator 320*b* may be electrically coupled to a second feedback voltage regulator 348. In some embodiments, the second comparator 320*b* may compare the scaled input voltage to a second scaled feedback voltage received from the second feedback voltage regulator 348. In these and other embodiments, the second comparator 320*b* may generate a second comparison voltage based on the comparison of the scaled input voltage to the second scaled feedback voltage. The second comparison voltage may include a digital voltage that may be equal to the high voltage or the low voltage in the first voltage range. In some embodiments, the second comparison voltage being equal to the high voltage may indicate that the scaled input voltage is greater than the second scaled feedback voltage and the second comparison voltage being equal to the low voltage may indicate that the second scaled feedback voltage is greater than the scaled input voltage.

The controller circuit 210 may include a first inverter 322. The first inverter 322 may receive the gain voltage. In addition, the first inverter 322 may generate an inverted gain voltage based on the gain voltage. For example, if the gain voltage is equal to the low voltage, the first inverter 322 may generate the inverted gain voltage to be equal to the high voltage. As another example, if the gain voltage is equal to the high voltage, the first inverter 322 may generate the inverted gain voltage to be equal to the low voltage.

The controller circuit 210 may also include a second inverter 323 electrically coupled to an output of the second comparator 320*b*. The second inverter 323 may receive the second comparison voltage from the second comparator 320*b*. The second inverter 323 may generate an inverted second comparison voltage based on the second comparison voltage. For example, if the second comparison voltage is equal to the low voltage, the second inverter 323 may generate the inverted second comparison voltage to be equal to the high voltage. As another example, if the second comparison voltage is equal to the high voltage, the second inverter 323 may generate the inverted second comparison voltage to be equal to the low voltage.

The controller circuit 210 may include a first OR gate 324*a*, a second OR gate 324*b*, or a third OR gate 324*c*. The first OR gate 324*a* may be electrically coupled to an output of the first comparator 320*a* and an output of the first inverter 322. The second OR gate 324*b* may be electrically coupled to the output of the second comparator 320*b* and the output of the first inverter 322. The third OR gate 324*c* may be electrically coupled to an output of the second inverter 323 and the output of the first inverter 322.

The first OR gate 324*a* may receive the first comparison voltage from the first comparator 320*a*. In addition, the first OR gate 324*a* may receive the inverted gain voltage from the first inverter 322. The first OR gate 324*a* may generate a first OR voltage that includes a digital voltage that may be equal to the high voltage or the low voltage in the first voltage range. The first OR voltage may be generated based on the first comparison voltage or the inverted gain voltage. For example, if the first comparison voltage or the inverted gain voltage are equal to the high voltage, the first OR voltage may be equal to the high voltage. As another example, if the first comparison voltage and the inverted gain voltage are both equal to the low voltage, the first OR voltage may be equal to the low voltage.

The second OR gate 324*b* may receive the second comparison voltage from the second comparator 320*b*. In addition, the second OR gate 324*b* may receive the inverted gain voltage from the first inverter 322. The second OR gate 324*b* may generate a second OR voltage that includes a digital voltage that may be equal to the high voltage or the low voltage in the first voltage range. The second OR voltage may be generated based on the second comparison voltage or the inverted gain voltage. For example, if the second comparison voltage or the inverted gain voltage are equal to the high voltage, the second OR voltage may be equal to the high voltage. As another example, if the second comparison voltage and the inverted gain voltage are both equal to the low voltage, the second OR voltage may be equal to the low voltage.

The third OR gate 324c may receive the inverted second comparison voltage from the second inverter 323. In addition, the third OR gate 324c may receive the inverted gain voltage from the first inverter 322. The third OR gate 324c may generate a third OR voltage that includes a digital voltage that may be equal to the high voltage or the low voltage in the first voltage range. The third OR voltage may be generated based on the inverted second comparison voltage or the inverted gain voltage. For example, if the inverted second comparison voltage or the inverted gain voltage are equal to the high voltage, the third OR voltage may be equal to the high voltage. As another example, if the inverted second comparison voltage and the inverted gain voltage are both equal to the low voltage, the third OR voltage may be equal to the low voltage. In some embodiments, the control voltage may be generated based on the first OR voltage, the second OR voltage, and the third OR voltage.

The controller circuit 210 may include a first AND gate 326a, a second AND gate 326b, or a third AND gate 326c. The first AND gate 326a may be electrically coupled to an output of the first OR gate 324a. The second AND gate 326b may be electrically coupled to an output of the second OR gate 324b. The third AND gate 326c may be electrically coupled to an output of the third OR gate 324c. In addition, the first AND gate 326a, the second AND gate 326b, or the third AND gate 326c may each receive the enable voltage.

The first AND gate 326a may receive the first OR voltage from the first OR gate 324a. The first AND gate 326a may generate a first AND voltage that includes a digital voltage that may be equal to the high voltage or the low voltage in the first voltage range. The first AND voltage may be generated based on the first OR voltage and the enable voltage. For example, if the first OR voltage and the enable voltage are both equal to the high voltage, the first AND voltage may be equal to the high voltage. As another example, if either the first OR voltage or the enable voltage are equal to the low voltage, the first AND voltage may be equal to the low voltage.

The second AND gate 326b may receive the second OR voltage from the second OR gate 324b. The second AND gate 326b may generate a second AND voltage that includes a digital voltage that may be equal to the high voltage or the low voltage in the first voltage range. The second AND voltage may be generated based on the second OR voltage and the enable voltage. For example, if the second OR voltage and the enable voltage are both equal to the high voltage, the second AND voltage may be equal to the high voltage. As another example, if either the second OR voltage or the enable voltage are equal to the low voltage, the second AND voltage may be equal to the low voltage.

The third AND gate 326c may receive the third OR voltage from the third OR gate 324c. The third AND gate 326c may generate a third AND voltage that includes a digital voltage that may be equal to the high voltage or the low voltage in the first voltage range. The third AND voltage may be generated based on the third OR voltage and the enable voltage. For example, if the third OR voltage and the enable voltage are both equal to the high voltage, the third AND voltage may be equal to the high voltage. As another example, if either the third OR voltage or the enable voltage are equal to the low voltage, the third AND voltage may be equal to the low voltage. In some embodiments, the control voltage may be generated based on the first AND voltage, the second AND voltage, or the third AND voltage.

The controller circuit 210 may include a first voltage level-shifter 328a, a second voltage level-shifter 328b, or a third voltage level-shifter 328c. The first voltage level-shifter 328a may be electrically coupled to an output of the first AND gate 326a. The second voltage level-shifter 328b may be electrically coupled to an output of the second AND gate 326b. The third voltage level-shifter 328c may be electrically coupled to an output of the third AND gate 326c.

In some embodiments, the first voltage level-shifter 328a, the second voltage level-shifter 328b, or the third voltage level-shifter 328c may shift the first AND voltage, the second AND voltage, or the third AND voltage (e.g., generate a first control voltage, a second control voltage, or a third control voltage) to be within a second voltage range. For example, in some embodiments, the first control voltage, the second control voltage, or the third control voltage may be equal to the input voltage. In these and other embodiments, the second voltage range may be a higher voltage range than the first voltage range.

The first voltage level-shifter 328a may receive the first AND voltage and the input voltage. The first voltage level-shifter 328a may generate the first control voltage that includes a digital voltage that may be equal to a high voltage or a low voltage in the second voltage range. In some embodiments, the first control voltage may be generated based on the first AND voltage and the input voltage. In these and other embodiments, the first voltage level-shifter 328a may include an inverter function that inverts the first control voltage. In some embodiments, if the first AND voltage is equal to the high voltage, the first voltage level-shifter 328a may generate the first control voltage to be equal to the low voltage (e.g., the first voltage level-shifter 328a may shift the high voltage of the first AND voltage to the low voltage of the first control voltage). If the first AND voltage is equal to the low voltage, the first voltage level-shifter 328a may generate the first control voltage to be equal to the high voltage (e.g., the first voltage level-shifter 328a may shift the low voltage of the first AND voltage to the high voltage of the first control voltage). In some embodiments, the first control voltage at the high voltage may be equal to or greater than the input voltage.

The second voltage level-shifter 328b may receive the second AND voltage and the input voltage. The second voltage level-shifter 328b may generate the second control voltage that includes a digital voltage that may be equal to the high voltage or the low voltage in the second voltage range. In some embodiments, the second control voltage may be generated based on the second AND voltage and the input voltage. In these and other embodiments, the second voltage level-shifter 328b may include an inverter function that inverts the second control voltage. In some embodiments, if the second AND voltage is equal to the high voltage, the second voltage level-shifter 328b may generate the second control voltage to be equal to the low voltage (e.g., the second voltage level-shifter 328b may shift the high voltage of the second AND voltage to the low voltage of the second control voltage). If the second AND voltage is equal to the low voltage, the second voltage level-shifter 328b may generate the second control voltage to be equal to the high voltage of the second voltage range (e.g., the second voltage level-shifter 328b may shift the low voltage of the second AND voltage to the high voltage of the second control voltage). In some embodiments, the second control voltage at the high voltage may be equal to or greater than the input voltage.

In some embodiments, the third voltage level-shifter 328c may receive the third AND voltage. Additionally, in some embodiments, the third voltage level-shifter 328c may receive a voltage via a drain of the second switch 330b. The third voltage level-shifter 328c may generate the third control voltage that includes a digital voltage that may be equal to the high voltage or the low voltage in the second voltage range. In some embodiments, the third control voltage may be generated based on the third AND voltage and the voltage on the drain of the second switch 330b. In these and other embodiments, the third voltage level-shifter 328c may include an inverter function that inverts the third control voltage. If the third AND voltage is equal to the high voltage or the voltage on the drain of the second switch 330b is less than the input voltage, the third voltage level-shifter 328c may generate the third control voltage at the low voltage (e.g., the third voltage level-shifter 328c may shift the high voltage of the third AND voltage to the low voltage of the third control voltage). If the third AND voltage is equal to the low voltage and the voltage on the drain of the second switch 330b is equal to the input voltage, the third voltage level-shifter 328c may generate the third control voltage to be equal to the high voltage of the second voltage range (e.g., the third voltage level-shifter 328c may shift the low voltage of the third AND voltage to the low voltage of the second control voltage). In some embodiments, the third control voltage at the high voltage may be equal to or greater than the input voltage.

The controller circuit 210 may include a buffer 334 that receives the gain voltage. The buffer may generate a fourth control voltage based on the gain voltage. The fourth control voltage may be equal to a buffered version of the gain voltage. In some embodiments, the first voltage may be based on the first control voltage, the second voltage may be based on the second control voltage, and the third voltage may be based on the third control voltage or the fourth control voltage.

The current regulator circuit 212 may include a first switch 330a, a second switch 330b, a third switch 330c, and a fourth switch 332. The first switch 330a may be electrically coupled to an output of the first voltage level-shifter 328a. The second switch 330b may be electrically coupled to an output of the second voltage level-shifter 328b. The third switch 330c may be electrically coupled to an output of the third voltage level-shifter 328c. The fourth switch 332 may be electrically coupled to an output of the buffer 334.

In some embodiments, the first switch 330a, the second switch 330b, the third switch 330c, or the fourth switch 332 may each include metal-oxide-semiconductor field-effect transistors (MOSFETs). In other embodiments, the first switch 330a, the second switch 330b, the third switch 330c, or the fourth switch 332 may each include gallium nitride (GaN) switches, silicon carbide (SiC) switches, or any other appropriate switch devices. In these and other embodiments, the first switch 330a, the second switch 330b, and the third switch 330c may include P-channel MOSFETs and the fourth switch 332 may include an N-channel MOSFET. Additionally or alternatively, a width to length (W/L) ratio of the first switch 330a, the second switch 330b, the third switch 330c, or the fourth switch 332 may be configured to limit the inrush current to pre-charge the capacitor 106 or the hold capacitor 108. In some embodiments, the W/L ratio of the first switch 330a, the second switch 330b, the third switch 330c, or the fourth switch 332 may cause a drain-source on resistance ($R_{DS(ON)}$) of the first switch 330a, the second switch 330b, the third switch 330c, or the fourth switch 332 to be high to limit the current that may occur while the capacitor 106 or the hold capacitor 108 are being pre-charged. For example, for an $R_{DS(ON)\ of}$ 2500 ohms and a voltage of one hundred seventy volts, the inrush current on the first switch 330a, the second switch 330b, the third switch 330c, or the fourth switch 332 may be limited to roughly seventy milliamps.

A gate of the first switch 330a may be electrically coupled to the output of the first voltage level-shifter 328a. A source of the first switch 330a may receive the input voltage. A drain of the first switch 330a may be electrically coupled to the first plate 107a of the capacitor 106. The first switch 330a may be configured to transition between the open position and the closed position. In the open position, the first switch 330a may prevent the input voltage from propagating the first switch 330a (e.g., propagating from the source to the drain of the first switch 330a) and may cause the first voltage to be equal to zero volts. In addition, in the open position, the first switch 330a may not pre-charge the first plate 107a of the capacitor 106. In the closed position, the first switch 330a may propagate the input voltage from the source to the drain of the first switch 330a. In addition, in the closed position, the first switch 330a may cause the first voltage to approach the input voltage. Further, in the closed position, the first switch 330a may pre-charge the first plate 107a of the capacitor 106 to be equal to the first voltage.

In some embodiments, the first control voltage may control the gate of the first switch 330a to cause the first switch 330a to transition between the open position and the closed position. In some embodiments, if the first control voltage is equal to the low voltage, the first switch 330a may transition to or remain in the closed position. In these and other embodiments, if the first control voltage is equal to the high voltage, the first switch 330a may transition to or remain in the open position.

A gate of the second switch 330b may be electrically coupled to the output of the second voltage level-shifter 328b. A source of the second switch 330b may receive the input voltage. A drain of the second switch 330b may be electrically coupled to the plate 109 of the hold capacitor 108. The second switch 330b may be configured to transition between the open position and the closed position. In the open position, the second switch 330b may prevent the input voltage from propagating the second switch 330b (e.g., propagating from the source to the drain of the second switch 330b) and may cause the third voltage to be equal to zero volts. In addition, in the open position, the second switch 330b may not pre-charge the plate 109 of the hold capacitor 108. In the closed position, the second switch 330b may propagate the input voltage from the source to the drain of the second switch 330b. In addition, in the closed position, the second switch 330b may cause the third voltage approach the input voltage. Further, in the closed position, the second switch 330b may pre-charge the plate 109 of the hold capacitor 108 to be equal to the third voltage.

In some embodiments, the second control voltage may control the gate of the second switch 330b to cause the second switch 330b to transition between the open position and the closed position. In some embodiments, if the second control voltage is equal to the low voltage, the second switch 330b may transition to or remain in the closed position. In these and other embodiments, if the second control voltage is equal to the high voltage, the second switch 330b may transition to or remain in the open position.

A gate of the third switch 330c may be electrically coupled to the output of the third voltage level-shifter 328c. A source of the third switch 330c may be electrically coupled to the drain of the second switch 330b. In some embodiments, if the second switch 330b is in the closed position, the source of the third switch 330c may receive the input voltage via the drain of the second switch 330b. In these and other embodiments, if the second switch 330b is in the open position, the source of the third switch 330c may receive a voltage that is less than the input voltage. For example, if the second switch 330b is in the open position, the source of the third switch 330c may receive a voltage equal to zero volts. A drain of the third switch 330c may be electrically coupled to the second plate 107b of the capacitor 106. The third switch 330c may be configured to transition between the open position and the closed position. In the open position, the third switch 330c may prevent the voltage on the source of the third switch 330c from propagating the third switch 330c (e.g., propagating from the source to the drain of the third switch 330c). In some embodiments, in the open position, the third switch 330c may cause the second voltage to be equal to zero volts. In addition, in the open position, the third switch 330c may not pre-charge the second plate 107b of the capacitor 106. In the closed position, the third switch 330c may propagate the voltage on the source of the third switch 330c from the source to the drain of the third switch 330c. In addition, in the closed position, the third switch 330c may cause the second voltage to approach the voltage on the source of the third switch 330c. Further, in the closed position, the third switch 330c may pre-charge the second plate 107b of the capacitor 106.

In some embodiments, the third control voltage may control the gate of the third switch 330c to cause the third switch 330c to transition between the open position and the closed position. In some embodiments, if the third control voltage is equal to the low voltage, the third switch 330c may transition to or remain in the closed position. In these and other embodiments, if the third control voltage is equal to the high voltage, the third switch 330c may transition to or remain in the open position.

A gate of the fourth switch 332 may be electrically coupled to the output of the buffer 334. A drain of the fourth switch 332 may be electrically coupled to the drain of the third switch 330c. In addition, the drain of the fourth switch 332 may be electrically coupled to the second plate 107b of the capacitor 106. In some embodiments, if the third switch 330c is in the open position, the drain of the fourth switch 332 may receive a voltage that is less than the voltage on the source of the third switch 330c. For example, if the third switch 330c is in the open position, the drain of the fourth switch 332 may receive a voltage equal to zero volts. In these and other embodiments, if the third switch 330c is in the closed position, the drain of the fourth switch 332 may receive a voltage equal to the voltage on the source of the third switch 330c.

A source of the fourth switch 332 may be electrically coupled to a ground of the system 100. The fourth switch 332 may be configured to transition between the open position and the closed. In the open position, the fourth switch 332 may prevent the drain of the third switch 330c and the second plate 107b of the capacitor 106 from being electrically coupled to the ground of the system 100. In addition, in the open position, the fourth switch 332 may cause the second voltage to be equal to the voltage on the drain of the third switch 330c. Further, in the open position, the fourth switch 332 may permit the third switch 330c to pre-charge the second plate 107b of the capacitor 106. In the closed position, the fourth switch 332 may electrically couple the drain of the third switch 330c and the second plate 107b of the capacitor 106 to the ground of the system 100. In addition, in the closed position, the fourth switch 332 may cause the second voltage to be equal to zero volts (e.g., a potential of the ground of the system 100). Further, in the closed position, the fourth switch 332 may prevent the third switch 330c from pre-charging the second plate 107b of the capacitor 106.

In some embodiments, the fourth control voltage may control the gate of the fourth switch 332 to cause the fourth switch 332 to transition between the open position and the closed position. In some embodiments, if the fourth control voltage is equal to the high voltage, the fourth switch 332 may transition to or remain in the closed position. In these and other embodiments, if the fourth control voltage is equal to the low voltage in first voltage range, the fourth switch 332 may transition or remain in the open position.

The feedback circuit 214 may include the first feedback voltage regulator 346 and a second feedback voltage regulator 348. The first feedback voltage regulator 346 may include resistors 316a-b configured as a voltage divider. The first feedback voltage regulator 346 may be electrically coupled to the drain of the first switch 330a and the first plate 107a of the capacitor 106. In some embodiments, the first feedback voltage regulator 346 may generate the first scaled feedback voltage based on the voltage on the first plate 107a of the capacitor 106 (e.g., the first voltage may be used as a first feedback voltage). In some embodiments, the resistors 316a-b may generate the first scaled feedback voltage as a divided version of the first voltage. In these and other embodiments, a size, a voltage rating, or a current rating of the resistors 316a-b may be based on the input voltage.

The second feedback voltage regulator 348 may include resistors 316c-d configured as a voltage divider. The second feedback voltage regulator 348 may be electrically coupled to the drain of the second switch 330b and the second plate 107b of the capacitor 106. In some embodiments, the second feedback voltage regulator 348 may generate the second scaled feedback voltage based on the voltage on the voltage on the second plate 107b of the capacitor 106 (e.g., the third voltage may be used as a second feedback voltage). In some embodiments, the resistors 316c-d may generate the second scaled feedback voltage as a divided version of the third voltage. In these and other embodiments, a size, a voltage rating, or a current rating of the resistors 316c-d may be based on the input voltage. In some embodiments, the resistors 316a-d may be scaled such that the state of the comparators 320 change when the first voltage or the third voltage are equal to the input voltage divided by two.

The voltage converter 104 may include a first switch 336a, a second switch 336b, a third switch 336c, a fourth switch 336d, or a fifth switch 336e (generally referred to in the present disclosure as "switches 336"). Each of the switches 336 may be electrically coupled to the capacitor 106. Pre-charging the capacitor 106 or the hold capacitor 108 using the pre-charge stage 102 may reduce or prevent damage to the switches 336 by limiting the currents on the switches 336 during accumulation of the initial charges on the capacitor 106 (e.g., the first plate 107a or the second plate 107b of the capacitor 106) of the hold capacitor 108 (e.g., the plate 109 of the hold capacitor 108). For example, the first switch 330a may be configured to limit the current on the switches 336 to pre-charge the first plate 107a of the capacitor 106. As another example, the third switch 330c or the fourth switch 332 may be configured to limit the current on the switches 336 to pre-charge the second plate 107b on the capacitor 106. As yet another example, the second switch 330b may be configured to limit the current on the switches 336 to pre-charge the plate 109 of the hold capacitor 108.

In some embodiments, for the second gain setting, the gain voltage may be equal to the high voltage. In these and other embodiments, the enable voltage may also be equal to the high voltage. Additionally or alternatively, the first inverter 322 may generate the inverter gain voltage equal to the low voltage. Further, in some embodiments, the buffer 334 may generate the fourth control voltage equal to the high voltage.

Operation of the system 100 during the pre-charge phase for the second gain setting prior to the capacitor 106 or the hold capacitor 108 being pre-charged to the steady state voltage will now be discussed. Prior to the capacitor 106 or the hold capacitor 108 being pre-charged to the steady state voltage, the scaled input voltage may be greater than the first scaled feedback voltage (e.g., zero volts) and the second scaled feedback voltage (e.g., zero volts). Therefore, the first comparator 320a may generate the first comparison voltage and the second comparator 320b may generate the second comparison voltage to be equal to the high voltage.

The first OR gate 324a may generate the first OR voltage equal to the high voltage. The first OR voltage may be equal to the high voltage due to the first comparison voltage being equal to the high voltage despite the inverted gain voltage being equal to the low voltage. The second OR gate 324b may generate the second OR voltage equal to the high voltage. The second OR voltage may be equal to the high voltage due to the second comparison voltage being equal to the high voltage in the first range despite the inverted gain voltage being equal to the low voltage. The third OR gate 324c may generate the third OR voltage equal to the low voltage. The third OR voltage may be equal to the low voltage due to the inverted second comparison voltage and the inverted gain voltage both being equal to the low voltage.

The first AND gate 326a may generate the first AND voltage equal to the high voltage. The first AND voltage may be equal to the high voltage due to the enable voltage and the first OR voltage both being equal to the high voltage. The second AND gate 326b may generate the second AND voltage equal to the high voltage. The second AND voltage may be equal to the high voltage due to the enable voltage and the second OR voltage both being equal to the high voltage. The third AND gate 326c may generate the third AND voltage equal to the low voltage. The third AND voltage may be equal to the low voltage due to the third OR voltage being equal to the low voltage despite the enable voltage being equal to the high voltage.

The first voltage level-shifter 328a may generate the first control voltage equal to the low voltage. The first control voltage may be equal to the low voltage due to the first AND voltage being equal to the high voltage and the inverter function of the first voltage level-shifter 328a. The second voltage level-shifter 328b may generate the second control voltage equal to the low voltage. The second control voltage may be equal to the low voltage due to the second AND voltage being equal to the high voltage and the inverter function of the second voltage level-shifter 328b. The third voltage level-shifter 328c may generate the third control voltage equal to the high voltage. The third control voltage may be equal to the high voltage due to the third AND voltage being equal to the low voltage and the inverter function of the third voltage level-shifter 328c.

The first switch 330a may transition to the closed position and may propagate the input voltage from the source to the drain of the first switch 330a. The first switch 330a may transition to the closed position due to the first control voltage being equal to the low voltage. In the closed position, the first switch 330a may cause the first voltage to approach the input voltage and the first plate 107a of the capacitor 106 may be pre-charged. The second switch 330b may transition to the closed position and may propagate the input voltage from the source to the drain of the second switch 330b. The second switch 330b may transition to the closed position due to the second control voltage being equal to the low voltage. In the closed position, the second switch 330b may cause the second voltage to approach the input voltage and the plate 109 of the hold capacitor 108 may be pre-charged. The third switch 330c may remain in the open position and may prevent the voltage on the source of the third switch 330c from propagating the third switch 330c. The third switch 330c may remain in the open position due to the third control voltage being equal to the high voltage. The fourth switch 332 may transition to the closed position and electrically couple the second plate 107b of the capacitor 106 to the ground of the system 100 (e.g., cause the second plate 107b of the capacitor 106 to be equal to ground). The fourth switch 332 may be in the closed position due to the fourth control voltage being equal to the high voltage.

Operation of the system 100 during the pre-charge phase for the second gain setting after the capacitor 106 or the hold capacitor 108 are pre-charged to the steady state voltage will now be discussed. After the capacitor 106 or the hold capacitor 108 are pre-charged to the steady state voltage, the scaled input voltage may be less than the first scaled feedback voltage (e.g., the input voltage divided by two) and the second scaled feedback voltage (e.g., the input voltage divided by two). Therefore, the first comparator 320a may generate the first comparison voltage and the second comparator 320b may generate the second comparison voltage equal to the low voltage.

The first OR gate 324a may generate the first OR voltage equal to the low voltage. The first OR voltage may be equal to the low voltage due to the first comparison voltage and the inverted gain voltage both being equal to the low voltage. The second OR gate 324b may generate the second OR voltage equal to the low voltage. The second OR voltage may be equal to the low voltage due to the second comparison voltage and the inverted gain voltage both being equal to the low voltage. The third OR gate 324c may generate the third OR voltage equal to the high voltage. The third OR voltage may be equal to the high voltage due to the inverted second comparison voltage being equal to the high voltage despite the inverted gain voltage being equal to the low voltage.

The first AND gate 326a may generate the first AND voltage equal to the low voltage. The first AND voltage may be equal to the low voltage due to the first OR voltage being equal to the low voltage despite the enable voltage being equal to the high voltage. The second AND gate 326b may generate the second AND voltage equal to the low voltage. The second AND voltage may be equal to the low voltage due to the second OR voltage being equal to the low voltage despite the enable voltage being equal to the high voltage. The third AND gate 326c may generate the third AND voltage equal to the high voltage. The third AND voltage may be equal to the high voltage due to the third OR voltage and the enable voltage both being equal to the high voltage.

The first voltage level-shifter 328a may generate the first control voltage equal to the high voltage. The first control voltage may be equal to the high voltage due to the first AND voltage being equal to the low voltage. The second voltage level-shifter 328b may generate the second control voltage equal to the high voltage. The second control voltage may be equal to the high voltage due to the second AND voltage being equal to the low voltage. The third voltage level-shifter 328c may generate the third control voltage equal to the high voltage. The third control voltage may be equal to the low voltage due to the third AND voltage being equal to the high voltage.

The first switch 330a may transition to the open position and may prevent the input voltage from propagating from the source to the drain of the first switch 330a. The first switch 330a may transition to the open position due to the first control voltage being equal to the high voltage. With the first switch 330a in the open position, the first voltage may not increase or decrease and the first plate 107a of the capacitor 106 may be equal to the corresponding steady state voltage. The second switch 330b may transition to the open position and may prevent the input voltage from propagating from the source to the drain of the second switch 330b. The second switch 330b may transition to the closed position due to the second control voltage being equal to the high voltage. With the second switch 330b in the open position, the third voltage may not increase or decrease and the plate 109 of the hold capacitor 108 may be equal to the corresponding steady state voltage. The third switch 330c may transition to the closed position and may permit the voltage on the source of the third switch 330c to propagate to the drain of the third switch 330c. The third switch 330c may transition to the closed position due to the third control voltage being equal to the low voltage.

If the period of time the pre-charge phase is to occur elapses (e.g., the pre-charge phase ends), the enable voltage may be equal to the low voltage and the pre-charge stage 102 may stop operation. In addition, the voltage converter 104 may start the operation of converting the input voltage to the output voltage. In some embodiments, for the second gain setting, the plate 109 of the hold capacitor 108 may be pre-charged equal to the input voltage divided by two. In these and other embodiments, for the second gain setting, the first plate 107a of the capacitor 106 may be pre-charged equal to the input voltage divided by two. Additionally or alternatively, for the second gain setting, the second plate 107b of the capacitor 106 may not be pre-charged and due to the second plate 107b of the capacitor 106 being electrically coupled to the ground of the system 100.

Operation of the system 100 during the pre-charge phase for the first gain setting will now be discussed. In some embodiments, for the first gain setting, the gain voltage may be equal to the low voltage. In these and other embodiments, the enable voltage may be equal to the high voltage. Additionally or alternatively, the first inverter 322 may generate the inverter gain voltage equal to the high voltage. Further, in some embodiments, the buffer 334 may generate the fourth control voltage equal to the low voltage.

In some embodiments, the inverter gain voltage being equal to the high voltage may override the first comparison signal, the second comparison signal, or the inverted second comparison signal. For example, the first OR gate 324a may generate the first OR voltage equal to the high voltage due to the inverted gain voltage always being equal to the high voltage (for the first gain setting during the pre-charge phase). As another example, the second OR gate 324b may generate the second OR voltage equal to the high voltage due to the inverted gain voltage always being equal to the high voltage (for the first gain setting during the pre-charge phase). As yet another example, the third OR gate 324c may generate the third OR voltage equal to the high voltage due to the inverted gain voltage always being equal to the high voltage (for the first gain setting during the pre-charge phase).

The first AND gate 326a may generate the first AND voltage equal to the high voltage due to the enable voltage and the first OR voltage both being equal to the high voltage. The second AND gate 326b may generate the second AND voltage equal to the high voltage due to the enable voltage and the second OR voltage both being equal to the high voltage. The third AND gate 326c may generate the third AND voltage equal to the high voltage due to the third OR voltage and the enable voltage both being equal to the high voltage.

The first voltage level-shifter 328a may generate the first control voltage equal to the low voltage due to the first AND voltage being equal to the high voltage and the inverter function of the first voltage level-shifter 328a. The second voltage level-shifter 328b may generate the second control voltage equal to the low voltage due to the second AND voltage being equal to the high voltage and the inverter function of the second voltage level-shifter 328b. The third voltage level-shifter 328c may generate the third control voltage equal to the low voltage due to the third AND voltage being equal to the high voltage range and the inverter function of the first voltage level-shifter 328a.

The first switch 330a may transition to the closed position due to the first control voltage being equal to the low voltage. The first switch 330a may propagate the input voltage from the source to the drain of the first switch 330a. With the first switch 330a in the closed position, the first voltage may approach the input voltage and the first plate 107a of the capacitor 106 may be pre-charged. The second switch 330b may transition to the closed position due to the second control voltage being equal to the low voltage. The second switch 330b may propagate the input voltage from the source to the drain of the second switch 330b. With the second switch 330b in the closed position, the second voltage may approach the input voltage and the plate 109 of the hold capacitor 108 may be pre-charged. The third switch 330c may transition to the closed position due to the third control voltage being equal to the low voltage. The third switch 330c may permit the voltage on the source of the third switch 330c to propagate to the drain of the third switch 330c.

The fourth switch 332 may remain in the open position due to the fourth control voltage being equal to the low voltage. The fourth switch 332 may prevent the second plate 107b of the capacitor 106 from being electrically coupled to the ground of the system 100. In some embodiments, for the first gain setting, the capacitor 106 or the hold capacitor 108 may be pre-charged to be equal to the input voltage.

During the operation phase, the switches 336 may transition between the open position and the closed position in particular sequences based on the gain setting of the voltage converter 104. Each switch may transition between the closed position and the open position based on one of two clock signals and the gain setting. In some embodiments, for the second gain setting, the third switch 336c may transition to and remain in the open position during the operation phase. In these and other embodiments, for the second gain setting, the first switch 336a and the fourth switch 336d may transition between the closed position and the open position based on a first clock signal and the second switch 336b and the fifth switch 336e may transition between the closed position and the open position based on a second clock signal. In some embodiments, for the first gain setting, the switches 336 may all transition to and remain in the closed position during the operation phase. In some embodiments, the first clock signal and the second clock signal may include non-overlapping phases.

In some embodiments, the various components within the pre-charge stage 102 or the voltage converter 104 may include discrete components. For example, the resistors 316a-d and 318a-b, the comparators 320, the first OR gate 324a, the second OR gate 324b, the third OR gate 324c, the first AND gate 326a, the second AND gate 326b, the third AND gate 326c, the first inverter 322, the second inverter 323, the buffer 334, the first voltage level-shifter 328a, the second voltage level-shifter 328b, the third voltage level-shifter 328c, the first switch 330a, the second switch 330b, the third switch 330c, the fourth switch 332, and the switches 336 may each be discrete components. In other embodiments, the various components within the pre-charge stage 102 or the voltage converter 104 may include components integrated into one or more substrates. For example, the resistors 316a-d and 318a-b, the comparators 320, the first OR gate 324a, the second OR gate 324b, the third OR gate 324c, the first AND gate 326a, the second AND gate 326b, the third AND gate 326c, the first inverter 322, the second inverter 323, the buffer 334, the first voltage level-shifter 328a, the second voltage level-shifter 328b, the third voltage level-shifter 328c, the first switch 330a, the second switch 330b, the third switch 330c, the fourth switch 332, and the switches 336 may be integrated into one or more substrates.

FIG. 4 illustrates another example configuration of the system 100 of FIG. 1, in accordance with at least one embodiment described in the present disclosure. General operation of the system 100 during the pre-charge phase will now be discussed. In some embodiments, the pre-charge stage 102 may be configured to operate in embodiments in which the voltage converter 104 applies the third gain setting. In these and other embodiments, the third gain setting may be greater than or equal to one. For example, the third gain setting may include a gain setting of two.

The controller circuit 210 may include a comparator 420, an OR gate 424, a first AND gate 426a, a second AND gate 426b, a first voltage level-shifter 428a, a second voltage level-shifter 428b, a third voltage level-shifter 428c, and a boost pump 429. The comparator 420 may be electrically coupled to the voltage regulator 344. More specifically, a positive input of the comparator 420 may be electrically coupled to the voltage regulator 344 such that the scaled input voltage is a reference voltage on the positive input of the comparator 420. In some embodiments, the resistors 318a-b of the voltage regulator 344 may be scaled to change a state of the comparator 420 (e.g., cause a comparison voltage generated by the comparator 420 to switch between the high voltage or the low voltage) if the voltage on the plate 109 of the hold capacitor 108 is equal to or greater than the input voltage multiplied by two.

A negative input of the comparator 420 may be electrically coupled to the second feedback voltage regulator 348. In some embodiments, the comparator 420 may compare the scaled input voltage to the second scaled feedback voltage. In these and other embodiments, the comparator 420 may generate the comparison voltage that includes a digital voltage that may be equal to the high voltage or the low voltage in the first voltage range. In some embodiments, the comparator 420 may generate the comparison voltage based on the comparison of the scaled input voltage and the second scaled feedback voltage. The comparison being equal to the high voltage may indicate that the scaled input voltage is greater than the second scaled feedback voltage and the comparison voltage being equal to the low voltage may indicate that the second scaled feedback voltage is greater than the scaled input voltage.

The OR 424 gate may be electrically coupled to an output of the first inverter 322 and an output of the comparator 420. The OR gate 424 may receive the comparison voltage from the comparator 420. In addition, the OR gate 424 may receive the inverted gain voltage from the first inverter 322. The OR gate 424 may generate an OR voltage that includes a digital voltage that may be equal to the high voltage or the low voltage in the first voltage range. The OR voltage may be generated based on the comparison voltage or the inverted gain voltage. For example, if either the comparison voltage or the inverted gain voltage are equal to the high voltage, the OR voltage may be equal to the high voltage. As another example, if the comparison voltage and the inverted gain voltage are both equal to the low voltage, the OR voltage may be equal to the low voltage.

The first AND gate 426a may receive the OR voltage from the OR gate 424. In addition, the first AND gate 426a may receive the enable voltage. The first AND gate 426a may generate the first AND voltage based on the OR voltage and the enable voltage. For example, if the OR voltage and the enable voltage are both equal to the high voltage, the first AND voltage may be equal to the high voltage. As another example, if either the OR voltage or the enable voltage are equal to the low voltage, the first AND voltage may be equal to the low voltage.

The second AND gate 426b may receive the inverted gain voltage from the first inverter 322. In addition, the second AND gate 426b may receive the enable voltage. The second AND gate 426b may generate the second AND voltage based on the inverted gain voltage and the enable voltage. For example, if the inverted gain voltage and the enable voltage are both equal to the high voltage, the second AND voltage may be equal to the high voltage. As another example, if either the inverted gain voltage or the enable voltage are equal to the low voltage, the second AND voltage may be equal to the low voltage.

In some embodiments, the first voltage level-shifter 428a, the second voltage level-shifter 428b, or the third voltage level-shifter 428c may shift the first AND voltage, the second AND voltage, or the enable voltage (e.g., generate the first control voltage, the second control voltage, or the third control voltage) to the high voltage or the low voltage in the second voltage range. For example, in some embodiments, the first control voltage, the second control voltage, or the third control voltage may be equal to the input voltage. The first voltage level-shifter 428a may operate the same as or similar to the first voltage level-shifter 328a discussed above in relation to FIG. 1.

The second voltage level-shifter 428b may receive the enable voltage and the input voltage. The second voltage level-shifter 428b may generate the second control voltage based on the enable voltage and the input voltage. In these and other embodiments, the second voltage level-shifter 428b may include an inverter function that inverts the second control voltage. In some embodiments, if the enable voltage is equal to the high voltage, the second voltage level-shifter 428b may generate the second control voltage to be equal to the low voltage (e.g., the second voltage level-shifter 428b may shift the high voltage of the enable voltage to the low voltage of the second control voltage).

In some embodiments, the third voltage level-shifter 428c may receive the second AND voltage. In addition, in some embodiments, the third voltage level-shifter 428c may receive the input voltage. The third voltage level-shifter 328c may generate the third control voltage based on the second AND voltage and the input voltage. In some embodiments, the third voltage level-shifter 428c may include an inverter function that inverts the third control voltage. If the second AND voltage is equal to the high voltage, the third voltage level-shifter 428c may generate the third control voltage to be equal to the low voltage (e.g., the third voltage level-shifter 428c may shift the high voltage of the second AND voltage to the low voltage of the third control voltage). If the second AND voltage is equal to the low voltage, the third voltage level-shifter 428c may generate the third control voltage to be equal to the high voltage (e.g., the third voltage level-shifter 428c may shift the low voltage of the third AND voltage to the low voltage of the second control voltage).

The boost pump 429 may be configured to increase (e.g., pump) the input voltage. In some embodiments, the boost pump 429 may generate a boost voltage based on the input voltage. In these and other embodiments, the boost voltage may be equal to or greater than the input voltage. For example, the boost voltage may be equal to the input voltage multiplied by two. In some embodiments, the boost voltage being greater than the input voltage may cause the current available for pre-charging the plate 109 of the hold capacitor 108 to be greater than if the input voltage is used. The boost pump 429 may generate the boost voltage based on the input voltage, the first AND voltage, or a clock signal (illustrated in FIG. 4 as CLK). The clock signal may control a duty cycle of at least a portion of components within the boost pump 429. In some embodiments, the first AND voltage may also control a duty cycle of at least a portion of the components within the boost pump 429.

The current regulator circuit 212 may include a first switch 430a, a second switch 430b, and a third switch 430c. The first switch 430a may be electrically coupled to an output of the first voltage level-shifter 428a. The second switch 430b may be electrically coupled to an output of the second voltage level-shifter 428b. The third switch 430c may be electrically coupled to an output of the third voltage level-shifter 428c.

In some embodiments, the first switch 430a, the second switch 430b, or the third switch 430c may each include MOSFETs. In these and other embodiments, the first switch 430a, the second switch 430b, and the third switch 430c may include P-channel MOSFETs. Additionally or alternatively, the W/L ratio of the first switch 430a, the second switch 430b, or the third switch 430c may be configured to limit the currents within the voltage converter 104 to pre-charge the capacitor 106 or the hold capacitor 108. In some embodiments, the W/L ratio of the first switch 430a, the second switch 430b, or the third switch 430c may cause the $R_D S(O_N)$ of the first switch 430a, the second switch 430b, or the third switch 430c to be high to limit the current that may occur while the capacitor 106 or the hold capacitor 108 are being pre-charged.

In some embodiments, the first switch 430a may generate the third voltage. A gate of the first switch 430a may be electrically coupled to the output of the first voltage level-shifter 428a. A source of the first switch 430a may receive a boost voltage from the boost pump 429. A drain of the first switch 430a may be electrically coupled to the plate 109 of the hold capacitor 108. The first switch 430a may be configured to transition between the open position and the closed position. In the open position, the first switch 430a may prevent the boost voltage from propagating the first switch 430a (e.g., propagating from the source to the drain of the first switch 430a) and may cause the third voltage to be equal to zero volts. In addition, in the open position, the first switch 430a may not pre-charge the plate 109 of the hold capacitor 108. In the closed position, the first switch 430a may propagate the boost voltage from the source to the drain of the first switch 430a. In addition, in the closed position, the first switch 430a may cause the third voltage to approach the boost voltage. Further, in the closed position, the first switch 430a may pre-charge the plate 109 of the hold capacitor 108 to be equal to the third voltage.

In some embodiments, the first control voltage may control the gate of the first switch 430a to cause the first switch 430a to transition between the open position and the closed position. In some embodiments, if the first control voltage is equal to the low voltage, the first switch 430a may transition to or remain in the closed position. In these and other embodiments, if the first control voltage is equal to the high voltage, the first switch 430a may transition to or remain in the open position.

In some embodiments, the second switch 430b may generate the first voltage. A gate of the second switch 430b may be electrically coupled to the output of the second voltage level-shifter 428b. A source of the second switch 430b may receive the input voltage. A drain of the second switch 430b may be electrically coupled to the first plate 107a of the capacitor 106. The second switch 430b may be configured to transition between the open position and the closed position. In the open position, the second switch 430b may prevent the input voltage from propagating the second switch 430b (e.g., propagating from the source to the drain of the second switch 430b) and may cause the first voltage to be equal to zero volts. In addition, in the open position, the second switch 430b may not pre-charge the first plate 107a of the capacitor 106. In the closed position, the second switch 430b may propagate the input voltage from the source to the drain of the second switch 430b. In addition, in the closed position, the second switch 430b may cause the first voltage approach the input voltage. Further, in the closed position, the second switch 430b may pre-charge the first plate 107a of the capacitor 106 to be equal to the first voltage.

In some embodiments, the second control voltage may control the gate of the second switch 430b to cause the second switch 430b to transition between the open position and the closed position. In some embodiments, if the second control voltage is equal to the low voltage, the second switch 430b may transition to or remain in the closed position. In these and other embodiments, if the second control voltage is equal to the high voltage, the second switch 430b may transition to or remain in the open position.

In some embodiments, the third switch 430c may generate the second voltage. A gate of the third switch 430c may be electrically coupled to the output of the third voltage level-shifter 428c. A source of the third switch 430c may receive the input voltage. A drain of the third switch 430c may be electrically coupled to the second plate 107b of the capacitor 106. The third switch 430c may be configured to transition between the open position and the closed position. In the open position, the third switch 430c may prevent the input voltage from propagating the third switch 430c (e.g., propagating from the source to the drain of the third switch 430c) and may cause the second voltage to be equal to zero volts. In addition, in the open position, the third switch 430c may not pre-charge the second plate 107b of the capacitor 106. In the closed position, the third switch 430c may propagate the input voltage from the source to the drain of the third switch 430c. In addition, in the closed position, the third switch 430c may cause the second voltage to approach the input voltage. Further, in the closed position, the third switch 430c may pre-charge the second plate 107b of the capacitor 106 to be equal to the second voltage.

In some embodiments, the third control voltage may control the gate of the third switch 430c to cause the third switch 430c to transition between the open position and the closed position.

In some embodiments, if the third control voltage is equal to the low voltage, the third switch 430c may transition to or remain in the closed position. In these and other embodiments, if the third control voltage is equal to the high voltage, the third switch 430c may transition to or remain in the open position.

In some embodiments, for the third gain setting, the gain voltage may be equal to the high voltage. In these and other embodiments, the enable voltage may also be equal to the high voltage. Additionally or alternatively, the first inverter 322 may generate the inverter gain voltage equal to the low voltage. Further, in some embodiments, the buffer 334 may generate the fourth control voltage equal to the high voltage.

Operation of the system 100 during the pre-charge phase for the third gain setting prior to the capacitor 106 or the hold capacitor 108 being pre-charged to the steady state voltage will now be discussed. Prior to the capacitor 106 or the hold capacitor 108 being pre-charged to the steady state voltage, the scaled input voltage may be greater than the second scaled feedback voltage (e.g., zero volts). Therefore, the comparator 420 may generate the comparison voltage equal to the high voltage.

The OR gate 424 may generate the OR voltage equal to the high voltage due to the comparison voltage being equal to the high voltage range despite the inverted gain voltage being equal to the low voltage. The first AND gate 426a may generate the first AND voltage equal to the high voltage due to the enable voltage and the OR voltage both being equal to the high voltage. The second AND gate 426b may generate the second AND voltage equal to the low voltage due to the inverted gain voltage being equal to the low voltage despite the enable voltage being equal to the high voltage.

The first voltage level-shifter 428a may generate the first control voltage equal to the low voltage due to the first AND voltage being equal to the high voltage and the inverter function of the first voltage level-shifter 428a. The second voltage level-shifter 428b may generate the second control voltage equal to the low voltage due to the enable voltage being equal to the high voltage and the inverter function of the second voltage level-shifter 328b. The third voltage level-shifter 428c may generate the third control voltage equal to the high voltage due to the third AND voltage being equal to the low voltage and the inverter function of the third voltage level-shifter 428c.

The first switch 430a may transition to the closed position and may propagate the boost voltage from the source to the drain of the first switch 430a due to the first control voltage being equal to the low voltage. With the first switch 430a in the closed position, the third voltage may approach the boost voltage and the plate 109 of the hold capacitor 108 may be pre-charged. The second switch 430b may transition to the closed position due to the second control voltage being equal to the low voltage. With the second switch 430b in the closed position, the second voltage may approach the input voltage and the first plate 107a of the capacitor 106 may be pre-charged. The third switch 430c may remain in the open position due to the third control voltage being equal to the high voltage. The fourth switch 332 may transition to the closed position and electrically couple the second plate 107b of the capacitor 106 to the ground of the system 100 due to the fourth control voltage being equal to the high voltage.

Operation of the system 100 during the pre-charge phase for the third gain setting after the capacitor 106 or the hold capacitor 108 are pre-charged to the steady state voltages will now be discussed. After the capacitor 106 or the hold capacitor 108 are pre-charged to the steady state voltages, the scaled input voltage may be less than the second scaled feedback voltage (e.g., the input voltage divided by two). Therefore, the comparator 420 may generate the comparison voltage equal to the low voltage. The OR gate 424 may generate the OR voltage equal to the low voltage due to the comparison voltage and the inverted gain voltage both being equal to the low voltage.

The first AND gate 426a may generate the first AND voltage equal to the low voltage due to the OR voltage being equal to the low voltage despite the enable voltage being equal to the high voltage. The second AND gate 326b may generate the second AND voltage equal to the low voltage due to the inverted gain voltage being equal to the low voltage despite the enable voltage being equal to the high voltage.

The first voltage level-shifter 428a may generate the first control voltage equal to the high voltage due to the first AND voltage being equal to the low voltage. The second voltage level-shifter 428b may generate the second control voltage equal to the low voltage due to the enable voltage being equal to the high voltage. The third voltage level-shifter 428c may generate the third control voltage equal to the high voltage due to the third AND voltage being equal to the low voltage.

The first switch 430a may transition to the open position due to the first control voltage being equal to the high voltage. With the first switch 430a in the open position, the third voltage may not increase or decrease and the plate 109 of the hold capacitor 108 may be equal to the corresponding steady state voltage. The second switch 430b may remain in the closed position. With the second switch 430b in the closed position, the second voltage may continue to approach or may be equal to the input voltage and the first plate 107a of the capacitor 106 may be pre-charged. The third switch 430c may remain in the open position and may prevent the input voltage from propagating to the drain of the third switch 430c.

If the period of time the pre-charge phase is to occur elapses (e.g., the pre-charge phase ends), the enable voltage may be equal to the low voltage and the pre-charge stage 102 may stop operation. In addition, the voltage converter 104 may start the operation of converting the input voltage to the output voltage.

During the operation phase, in some embodiments, for the third gain setting, the fourth switch 336d may transition to and remain in the open position during the operation phase. In these and other embodiments, for the third gain setting, the first switch 336a and the fifth switch 336e may transition based on the first clock signal and the second switch 336b and the third switch 336c may transition based on the second clock signal.

In some embodiments, the various components within the pre-charge stage 102 or the voltage converter 104 may include discrete components. For example, the resistors 316c-d and 318a-b, the comparator 420, the OR gate 424, the first AND gate 426a, the second AND gate 426b, the first inverter 322, the buffer 334, the first voltage level-shifter 428a, the second voltage level-shifter 428b, the third voltage level-shifter 428c, the first switch 430a, the second switch 430b, the third switch 430c, the fourth switch 332, and the switches 336 may each be discrete components. In other embodiments, the various components within the pre-charge stage 102 or the voltage converter 104 may include components integrated into one or more substrates. For example, the resistors 316c-d and 318a-b, the comparator 420, the OR gate 424, the first AND gate 426a, the second AND gate 426b, the first inverter 322, the buffer 334, the first voltage level-shifter 428a, the second voltage level-shifter 428b, the third voltage level-shifter 428c, the first switch 430a, the second switch 430b, the third switch 430c, the fourth switch 332, and the switches 336 may be integrated into one or more substrates.

Figure 5A:
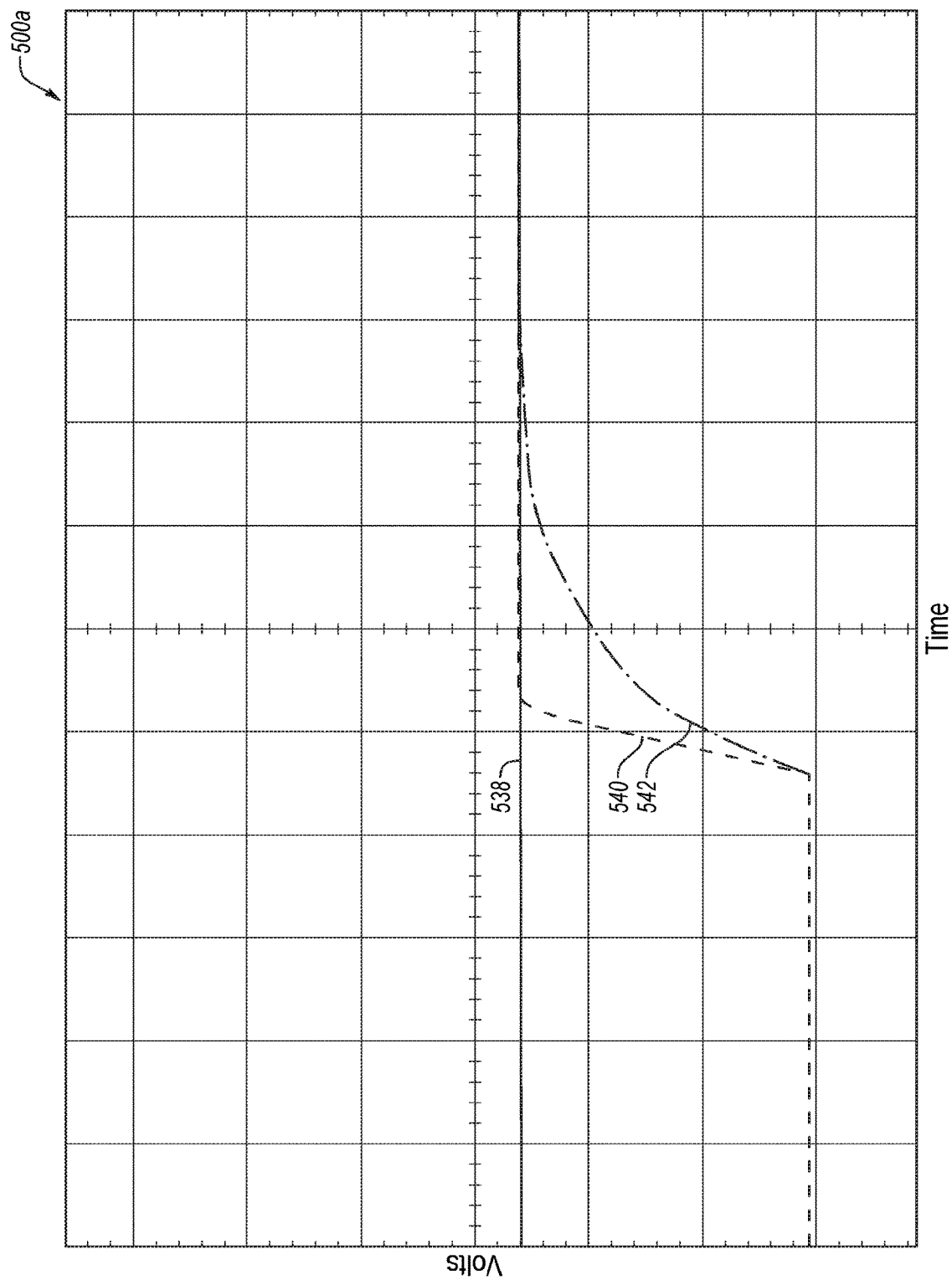
FIG. 5A illustrates a graphical representation of voltages on a first plate of a capacitor and a plate of a hold capacitor of the switched capacitor voltage converter of FIG. 1 using a first gain setting.

In some embodiments, the first gain setting may include a gain setting of one, the second gain setting may include a gain setting of 0.5, and the third gain setting may include a gain setting of two. In other embodiments, the first gain setting, the second gain setting, and the third gain setting may include different gain setting values and the various components within the pre-charge stage 102 may be scaled based on the different gain setting values FIG. 5A illustrates an oscilloscope waveform capture of voltages on the first plate 107a of the capacitor 106 and the plate 109 of the hold capacitor 108 of the SCVC 104 of FIG. 1 using the first gain setting, in accordance with at least one embodiment disclosed in the present disclosure. In FIG. 5A waveform 440 may represent the third voltage (e.g., the voltage on the plate 109 of the hold capacitor 108). In addition, in FIG. 5A, waveform 442 may represent the first voltage (e.g., the voltage on the first plate 107a of the capacitor 106). Further, waveform 438 may represent the input voltage. For FIG. 5A, the oscilloscope scale was set to fifty volts per division and the input voltage was equal to one hundred- thirty volts.

As illustrated in FIG. 5A, the first voltage and third voltage may initially be equal to zero volts. When the pre-charge phase starts (e.g., when the enable voltage transitions to the high voltage, which is not illustrated in FIG. 5A) the first voltage and the third voltage may approach the input voltage (e.g., may transition from zero volts and approach one hundred-thirty volts). In FIG. 5A, a period of time between initiation of the pre-charge phase and the first voltage and the third voltage reaching the input voltage was equal to sixty milliseconds. In some embodiments, the period of time the pre-charge phase is to occur for the first gain setting may be set to be sixty milliseconds or longer.

Figure 5B:
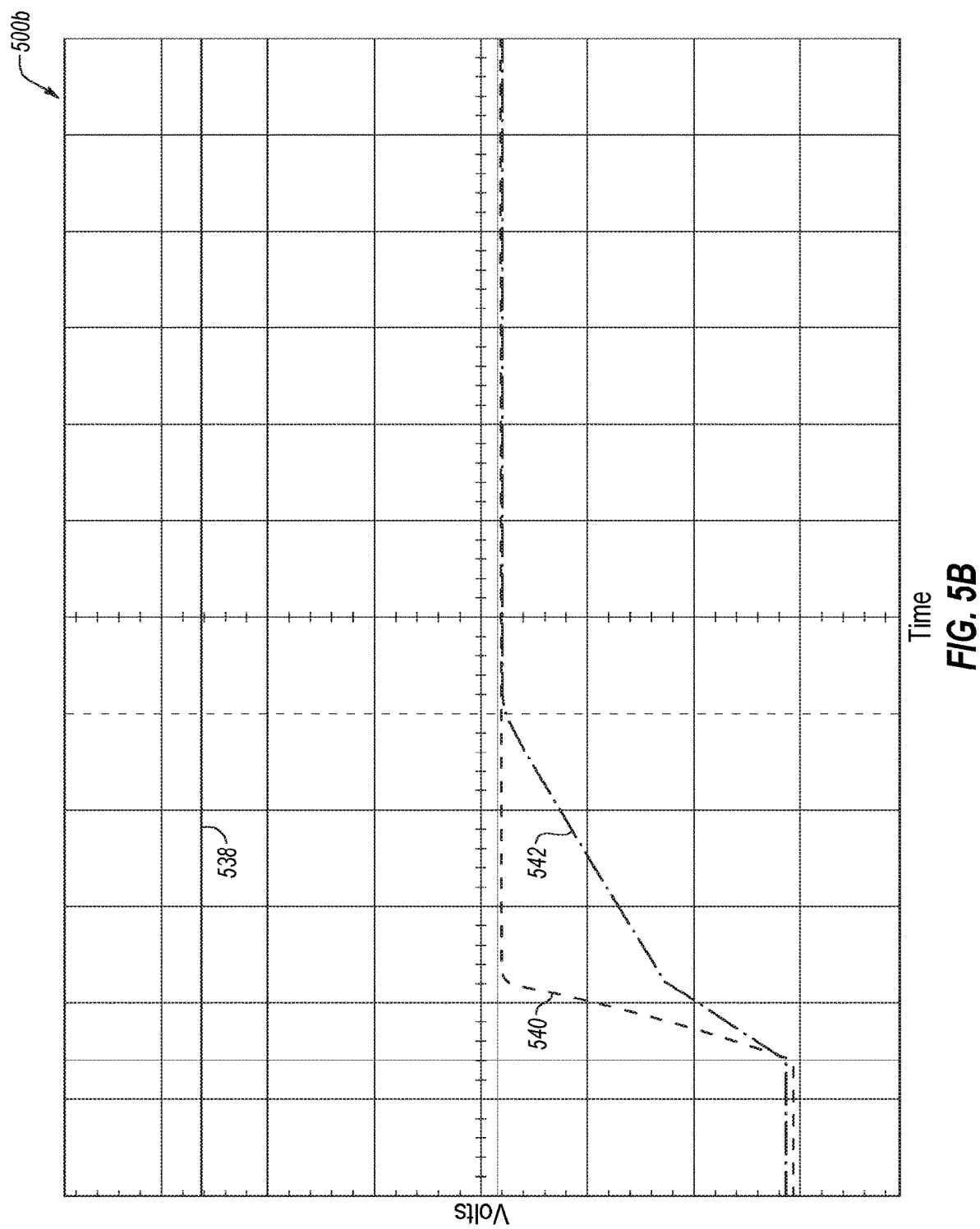
FIG. 5B illustrates a graphical representation of the voltages on the first plate of the first capacitor and the plate of the hold capacitor of the switched capacitor voltage converter of FIG. 1 using a second gain setting, all according to at least one implementation described in the present disclosure.

FIG. 5B illustrates an oscilloscope waveform capture of the voltages on the first plate 107a of the capacitor 106 and the plate 109 of the hold capacitor 108 of the SCVC 104 of FIG. 1 using the second gain setting, in accordance with at least one embodiment disclosed in the present disclosure. For FIG. 5B, the oscilloscope scale was set to fifty volts per division and the input voltage was equal to two hundred-eighty volts.

As illustrated in FIG. 5B, the first voltage and third voltage may initially be equal to zero volts. When the pre-charge phase starts (e.g., when the enable voltage transitions to the high voltage, which is not illustrated in FIG. 5B) the first voltage and the third voltage may approach the input voltage divided-by-two (e.g., may transition from zero volts and approach one hundred-forty volts). In FIG. 5B, the period of time between initiation of the pre-charge phase and the first voltage and the third voltage reaching the input voltage was equal to sixty milliseconds. In some embodiments, the period of time the pre-charge phase is to occur for the second gain setting may be set to be sixty milliseconds or longer.

In accordance with common practice, the various features illustrated in the drawings may not be drawn to scale. The illustrations presented in the present disclosure are not meant to be actual views of any particular apparatus (e.g., device, system, etc.) or method, but are merely representations that are employed to describe various embodiments of the disclosure. Accordingly, the dimensions of the various features may be arbitrarily expanded or reduced for clarity. In addition, some of the drawings may be simplified for clarity. Thus, the drawings may not depict all of the components of a given apparatus (e.g., device) or all operations of a particular method.

Terms used in the present disclosure and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," among others).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

Additionally, the use of the terms "first," "second," "third," etc., are not necessarily used in the present disclosure to connote a specific order or number of elements. Generally, the terms "first," "second," "third," etc., are used to distinguish between different elements as generic identifiers. Absence a showing that the terms "first," "second," "third," etc., connote a specific order, these terms should not be understood to connote a specific order. Furthermore, absence a showing that the terms "first," "second," "third," etc., connote a specific number of elements, these terms should not be understood to connote a specific number of elements. For example, a first widget may be described as having a first side and a second widget may be described as having a second side. The use of the term "second side" with respect to the second widget may be to distinguish such side of the second widget from the "first side" of the first widget and not to connote that the second widget has two sides.

All examples and conditional language recited in the present disclosure are intended for pedagogical objects to aid the reader in understanding the invention and the concepts contributed by the inventor to furthering the art, and are to be construed as being without limitation to such specifically recited examples and conditions. Although embodiments of the present disclosure have been described in detail, it should be understood that the various changes, substitutions, and alterations could be made hereto without departing from the spirit and scope of the present disclosure.

The invention claimed is:

1. A system comprising:
   a controller circuit configured to generate a control voltage based on an input voltage, a scaled feedback voltage, and a gain voltage, the gain voltage indicating a gain setting of a corresponding voltage converter;
   a current regulator circuit configured to:
     generate a first voltage based on the input voltage and the control voltage;
     pre-charge a voltage on a first plate of a capacitor to be equal to the first voltage;
     regulate a current on a switch during accumulation of an initial charge on the capacitor; and
     generate a feedback voltage based on the first voltage; and
   a feedback circuit configured to scale the feedback voltage to the scaled feedback voltage.

2. The system of claim 1, wherein the current regulator circuit is configured to regulate the current on the switch during accumulation of the initial charge on the capacitor by limiting the current on the switch during accumulation of the initial charge.

3. The system of claim 1, wherein:
   the feedback voltage comprises a first feedback voltage and a second feedback voltage;
   the scaled feedback voltage comprises a first scaled feedback voltage and a second scaled feedback voltage; and
   the controller circuit comprises:
     a voltage regulator configured to scale the input voltage to a scaled input voltage;
     a first comparator configured to:
       compare the scaled input voltage to the first scaled feedback voltage; and
       generate a first comparison voltage based on the comparison; and
     a second comparator configured to:
       compare the scaled input voltage to the second scaled feedback voltage; and
       generate a second comparison voltage based on the comparison, wherein:
         the feedback circuit is configured to:
           generate the first scaled feedback voltage based on the first feedback voltage; and
           generate the second scaled feedback voltage based on the second feedback voltage; and
         the controller circuit is configured to generate the control voltage based on the first comparison voltage and the second comparison voltage.

4. The system of claim 3 wherein:
   the first comparison voltage comprises a digital voltage; and
   a high voltage indicates the scaled input voltage is greater than the first scaled feedback voltage and a low voltage indicates the first scaled feedback voltage is greater than the scaled input voltage.

5. The system of claim 3, wherein the voltage regulator is configured as a voltage divider and the scaled input voltage is a divided version of the input voltage.

6. The system of claim 3, wherein the current regulator circuit comprises a first switch configured to transition between an open position and a closed position based on the control voltage, in the closed position the first switch propagates the input voltage such that the first voltage is equal to the input voltage.

7. The system of claim 6, wherein the controller circuit further comprises:
   a first inverter configured to generate an inverted gain voltage based on the gain voltage; and
   a first OR gate configured to generate a first OR voltage based on the first comparison voltage and the inverted gain voltage, wherein the controller circuit is configured to generate the control voltage based on the first OR voltage.

8. The system of claim 7, wherein the controller circuit further comprises a first AND gate configured to generate a first AND voltage based on the first OR voltage and an enable voltage, wherein the controller circuit is configured to generate the control voltage based on the first AND voltage.

9. The system of claim 8, wherein the controller circuit further comprises a first voltage level-shifter configured to generate the control voltage based on the input voltage and the first AND voltage.

10. The system of claim 1, wherein:
    the current regulator circuit is further configured to generate a second voltage and a third voltage based on the input voltage and the control voltage;
    the current regulator circuit is configured to generate the feedback voltage further based on the third voltage; and
    the system further comprises the corresponding voltage converter comprising:
      the capacitor comprising:
        the first plate; and
        a second plate, wherein the current regulator circuit is further configured to pre-charge a voltage on the second plate to be equal to the second voltage; and
      a hold capacitor comprising a plate, wherein the current regulator circuit is further configured to pre-charge a voltage on the plate to be equal to the third voltage; and
      the switch.

11. The system of claim 10, wherein the controller circuit is further configured to:
    compare the input voltage to the scaled feedback voltage; and
    generate the control voltage based on the comparison and the gain voltage, the gain voltage comprising a digital voltage, wherein a low voltage indicates a first gain setting is to be used in the corresponding voltage converter and a high voltage indicates a second gain setting is to be used in the corresponding voltage converter.

12. The system of claim 1, wherein the current regulator circuit is further configured to:
    pre-charge the voltage on the first plate during a pre-charge phase; and regulate the current on the switch during accumulation of the initial charge on the capacitor during an operation phase.

13. The system of claim 12, wherein:
the pre-charge phase ends and the operation phase starts after a programmable time period; and
the current on the switch at initiation of the operation phase is reduced due to the first plate being pre-charged by the current regulator circuit.

14. The system of claim 12, wherein the controller circuit is configured to generate the control voltage further based on an enable voltage comprising a digital voltage, wherein a high voltage indicates the pre-charge phase is occurring and a low voltage indicates the operation phase is occurring.

15. A system comprising:
a controller circuit configured to:
compare an input voltage to a scaled feedback voltage; and
generate a control voltage based on the comparison and an enable voltage, the enable voltage indicating a phase of charging a capacitor;
a current regulator circuit configured to:
generate a first voltage based on the input voltage and the control voltage;
generate a feedback voltage based on the first voltage;
pre-charge a voltage on a first plate of the capacitor to be equal to the first voltage; and
regulate a current on a switch during accumulation of an initial charge on the capacitor; and
a feedback circuit configured to scale the feedback voltage to the scaled feedback voltage.

16. The system of claim 15, wherein:
the controller circuit comprises:
a voltage regulator configured to scale the input voltage to a scaled input voltage;
a first comparator configured to:
compare the scaled input voltage to the scaled feedback voltage; and
generate a comparison voltage based on the comparison, wherein:
the feedback circuit is further configured to generate the scaled feedback voltage based on the feedback voltage; and
the control voltage is based on the comparison voltage; and
the system further comprises a voltage converter comprising:
the capacitor comprising the first plate; and
the switch.

17. The system of claim 16, wherein:
the current regulator circuit comprises a first switch configured to transition between an open position and a closed position based on the control voltage, in the closed position the first switch propagates the input voltage such that the first voltage is equal to the input voltage; and
the controller circuit further comprises:
a first inverter configured to generate an inverted gain voltage based on a gain voltage;
a first OR gate configured to generate a first OR voltage based on the comparison voltage and the inverted gain voltage;
a first AND gate configured to generate a first AND voltage based on the first OR voltage and the enable voltage; and
a first voltage level-shifter configured to generate the control voltage based on the input voltage and the first AND voltage.

18. The system of claim 17, wherein the controller circuit further comprises:
a second comparator configured to:
compare the scaled input voltage to a second scaled feedback voltage; and
generate a second comparison voltage based on the comparison, wherein the feedback circuit is further configured to generate the second scaled feedback voltage based on the feedback voltage;
a second inverter configured to generate an inverted second comparison voltage based on the second comparison voltage; and
a second OR gate configured to generate a second OR voltage based on the second comparison voltage and the inverted gain voltage, wherein the control voltage is based on the first OR voltage and the second OR voltage.

19. The system of claim 18, wherein the controller circuit further comprises a second AND gate configured to generate a second AND voltage based on the second OR voltage and the enable voltage, wherein the control voltage is based on the first AND voltage and the second AND voltage.

20. The system of claim 19, wherein:
the current regulator circuit is further configured to generate a second voltage based on the input voltage and the control voltage; the control voltage comprises a first control voltage and a second control voltage;
the first voltage level-shifter is configured to generate the first control voltage based on the input voltage and the first AND voltage;
the controller circuit further comprises a second voltage level-shifter configured to generate the second control voltage based on the input voltage and the second AND voltage;
the first voltage is based on the first control voltage; and
the second voltage is based on the second control voltage.

* * * * *